(12) United States Patent
Shimizu et al.

(10) Patent No.: US 8,994,034 B2
(45) Date of Patent: Mar. 31, 2015

(54) SEMICONDUCTOR DEVICE AND METHOD OF MANUFACTURING THE SAME

(75) Inventors: Tatsuo Shimizu, Tokyo (JP); Yoshinori Tsuchiya, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 13/404,411

(22) Filed: Feb. 24, 2012

(65) Prior Publication Data

US 2013/0062623 A1 Mar. 14, 2013

(30) Foreign Application Priority Data

Sep. 9, 2011 (JP) ................................. 2011-196954

(51) Int. Cl.
| | |
|---|---|
| *H01L 29/16* | (2006.01) |
| *H01L 21/04* | (2006.01) |
| *H01L 29/739* | (2006.01) |
| *H01L 29/45* | (2006.01) |
| *H01L 29/66* | (2006.01) |
| *H01L 29/78* | (2006.01) |
| *H01L 21/265* | (2006.01) |
| *H01L 29/08* | (2006.01) |

(52) U.S. Cl.
CPC .......... *H01L 21/0485* (2013.01); *H01L 21/049* (2013.01); *H01L 29/1608* (2013.01); *H01L 29/7395* (2013.01); *H01L 29/45* (2013.01); *H01L 29/66068* (2013.01); *H01L 29/7813* (2013.01); *H01L 21/26506* (2013.01); *H01L 29/0878* (2013.01)
USPC ............... 257/77; 257/E29.104; 257/E29.266

(58) Field of Classification Search
CPC ..................... H01L 29/1608; H01L 29/66068; H01L 29/7802
USPC ............................. 257/77, E29.104, E29.266
See application file for complete search history.

(56) References Cited

U.S. PATENT DOCUMENTS

| | | | | |
|---|---|---|---|---|
| 6,153,920 | A * | 11/2000 | Gossmann et al. ........... | 257/607 |
| 7,732,859 | B2 * | 6/2010 | Anderson et al. ............. | 257/328 |
| 8,604,545 | B2 * | 12/2013 | Shimomura et al. ........... | 257/347 |
| 2003/0173580 | A1 * | 9/2003 | Coolbaugh et al. ........... | 257/183 |
| 2005/0181536 | A1 * | 8/2005 | Tsuji ............................. | 438/105 |
| 2005/0191816 | A1 * | 9/2005 | Vanderpool et al. .......... | 438/305 |
| 2006/0022266 | A1 * | 2/2006 | Messenger et al. ........... | 257/347 |
| 2006/0121660 | A1 * | 6/2006 | Rhee et al. .................... | 438/197 |

(Continued)

FOREIGN PATENT DOCUMENTS

| | | |
|---|---|---|
| JP | 2008-053667 A | 3/2008 |
| JP | 2010-512006 A | 4/2010 |

OTHER PUBLICATIONS

U.S. Appl. No. 13/213,561, filed Aug. 19, 2011, Tatsuo Shimizu, et al.

(Continued)

*Primary Examiner* — Steven J Fulk
(74) *Attorney, Agent, or Firm* — Oblon, Spivak, McClelland, Maier & Neustadt, L.L.P.

(57) ABSTRACT

Disclosed is a semiconductor device including: a first electrode formed of a conductive material; a p-type first silicon carbide (SiC) semiconductor section and an n-type second SiC semiconductor section 230, connected to the first electrode, containing carbon (C) such that a surface density distribution has a peak at a first interface with the first electrode.

14 Claims, 17 Drawing Sheets

4H-SiC power DiMOSFET

(56) References Cited

U.S. PATENT DOCUMENTS

| | | | |
|---|---|---|---|
| 2006/0216900 A1* | 9/2006 | Wang et al. | 438/306 |
| 2006/0220027 A1* | 10/2006 | Takahashi et al. | 257/77 |
| 2006/0267022 A1* | 11/2006 | Mizukami et al. | 257/77 |
| 2007/0164375 A1* | 7/2007 | Ohta et al. | 257/408 |
| 2007/0281413 A1* | 12/2007 | Li et al. | 438/201 |
| 2008/0023732 A1* | 1/2008 | Felch et al. | 257/288 |
| 2008/0108190 A1* | 5/2008 | Matocha | 438/197 |
| 2008/0128806 A1* | 6/2008 | Liu et al. | 257/347 |
| 2008/0135954 A1* | 6/2008 | Ohmi et al. | 257/411 |
| 2009/0047772 A1* | 2/2009 | Tsuchida et al. | 438/473 |
| 2010/0012988 A1* | 1/2010 | Yang et al. | 257/288 |
| 2010/0171181 A1* | 7/2010 | Rhee et al. | 257/369 |
| 2011/0095339 A1* | 4/2011 | Hong et al. | 257/288 |
| 2012/0003438 A1* | 1/2012 | Appleton et al. | 428/195.1 |

OTHER PUBLICATIONS

Satoshi Tanimoto, et al., "Practical Device-Directed Ohmic Contacts on 4H—SiC", The transactions of the Institute of Electronics, Information and Communication Engineers, C, vol. J86-C, No. 4, Apr. 2003, pp. 359-367.

Japanese Office Action dated Sep. 4, 2014, issued in Japanese Patent Application No. 2011-196954 (with English translation).

Japanese Office Action dated Feb. 10, 2015, issued in Japanese Application No. 2011-196954 (with English Translation).

* cited by examiner

Epi-Ch

SEMICONDUCTOR DEVICE AND METHOD OF MANUFACTURING THE SAME

CROSS-REFERENCE TO RELATED APPLICATION

This application is based upon and claims the benefit of priority from the prior Japanese Patent application No. JP2011-196954, filed on Sep. 9, 2011; the entire contents of which are incorporated herein by reference.

FIELD

Embodiments described herein relate generally to a semiconductor device and a method of manufacturing the same.

BACKGROUND

In semiconductor devices, it is desired to provide a low-resistance contact between an n-type or p-type region and metal. In the case of Si devices, for the same metal, a sum of the potential barriers between the n-type or p-type region and metal is at about 1 eV of the bandgap energy. In this case, it is possible to obtain a sufficiently low contact resistance by sufficiently increasing the amount of dopants in both regions. That is, since the potential barrier is sufficiently low, and dopants are sufficiently introduced and activated, a dual contact with both the n-type region and the p-type region can be easily formed without a difficult problem.

However, in the case of SiC devices, a sum of the potential barriers between the n-type or p-type region and metal is about 3 eV of the bandgap energy. In this regard, in practice, it is necessary to prepare two kinds of separate metal materials for the n-type region and the p-type region for use in the electrode. Currently, it is difficult to provide a dual low-resistance contact with both the n-type region and the p-type region using a single metallic material.

In addition, a long-time high-temperature process is indispensable in order to introduce and activate dopants with a high concentration. This is not practical.

DETAILED DESCRIPTION

Figure 1:
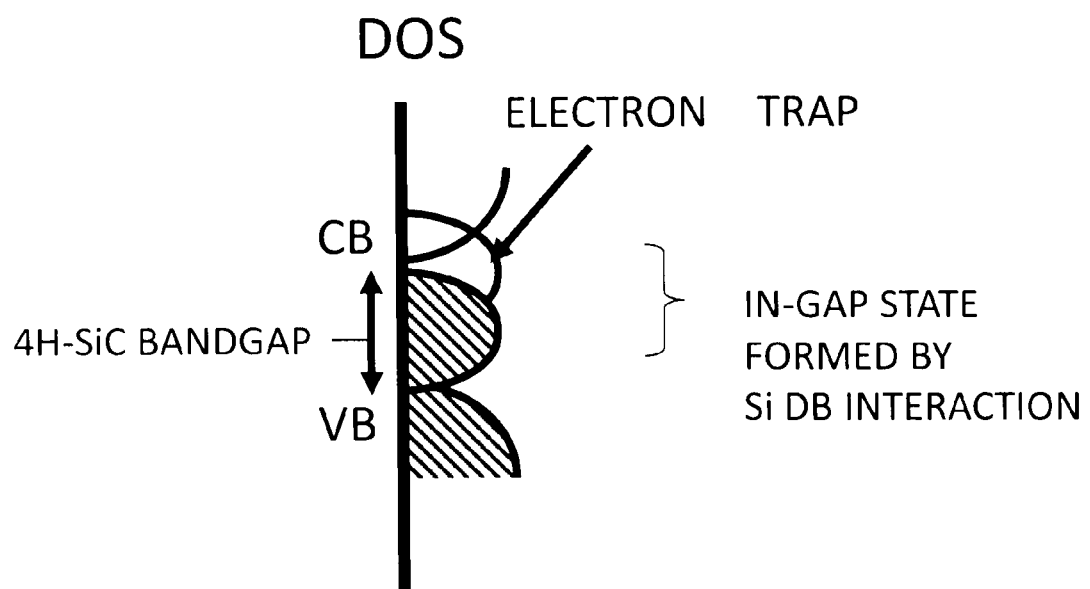
FIG. 1 is a diagram illustrating a principle according to an embodiment.

Embodiments described herein have been made to provide a semiconductor device including an n-type semiconductor region and a p-type semiconductor region formed on the SiC semiconductor substrate, in which a dual contact is formed across both the n-type semiconductor region and the p-type semiconductor region using a single metal electrode.

According to an aspect, there is provided a semiconductor device including: a first electrode formed of a conductive material; a p-type first silicon carbide (SiC) semiconductor section, connected to the first electrode, containing carbon (C) such that a surface density distribution has a peak at a first interface with the first electrode; and an n-type second SiC semiconductor section connected to the first electrode.

Hereinafter, how to achieve the present embodiment, a principle thereof, and the like will be described.

As described above, as the SiC semiconductor devices are further miniaturized in the future, it is necessary to provide a dual ohmic contact with both the n-type SiC region and the p-type SiC region within a single SiC device using a single metal material. Problems are generated in the on-resistance increases in the n-type SiC region, and in a switching speed in the p-type SiC region because a resistance and a capacitance are formed effectively. Furthermore, it is indispensable to form a dual low-resistance contact from the viewpoint of restriction in the junction accuracy or process simplification. That is, it is indispensable to form a low-resistance contact with both the n-type SiC region and the p-type SiC region using a single electrode.

Currently, for a contact with the large n-type region, an interfacial reaction layer in a high-temperature process is used to obtain an excellent value. However, for a contact with the p-type region, it is not to say that a perfectly sufficient value is obtained even in a large area. This is due to a material property of SiC. That is, this material has a large bandgap. If the electrode is capable of making contact with the n-type region, the potential barrier with the p-type region has high bandgap energy. Therefore, this is an intrinsic problem of a wide gap semiconductor.

If the contact resistance with the p-type region is high, an RC time constant for driving the device increases, and an operational speed is delayed. In addition, in the case of a device where a significant amount of electric currents flow through the p-type region (for example, an insulated gate bipolar transistor (IGBT) shown in Example 3 described below), a significant loss is generated. In particular, this is a significant problem in a structure where the n-type SiC region and the p-type SiC region are adjacent, and they are necessarily maintained in an identical electric potential. The devices provided in Examples 1 to 4 described below are examples in which the n-type SiC region and the p-type SiC region are adjacent. In such devices, although an npn bipolar transistor is buried structurally, the carrier injection from the n-type region to the p-type region is inhibited in order to control the operation of the transistor.

A large amount of C defects are generated in the SiC substrate during each process of high-concentration ion implantation ($p^+$ and $n^+$), sacrificial oxide film formation, and high-temperature electrode formation.

According to the first principle calculation carried out by the inventors as an electronic state calculation technique, an energy level of 7 to 8 eV is necessary to generate a defect in Si assuming that discharged Si particles form an Si bulk. An energy level of approximately 5 eV is also necessary in the vicinity of the SiC substrate surface. On the contrary, the C defect is exhibited at an energy level of approximately 4 eV assuming that the discharged carbon particles form a carbon bulk. Furthermore, the C defect is exhibited at a low energy level of 0.75 to 2 eV in the surface of the SiC substrate. In the aforementioned process, a significant amount of C defects are generated naturally because the C defects are easily generated on the surface of the SiC substrate, at an interface with $SiO_2$, and an interface with metal.

Here, the first principle calculation is performed based on a density functional method using local density approximation. For Si, a norm-conserving pseudo potential is used. For materials such as C other than Si, an ultra-soft pseudo potential, developed by Vanderbilt et al., is used.

As illustrated in FIG. 1, if the C defect is generated, an in-gap state may be exhibited, or a band structure of the conduction band edge is changed so as to generate a local resistance change area. That is, the C defect causes in-plane irregularity of the electric current. It is indispensable to form a cell having a uniform in-plane resistance (bulk and contact) in order to improve the device characteristic. If the current state is maintained as it is, a local breakdown is generated, and a device lifetime is reduced. In order to implement the device appropriately, it is indispensable to reduce the C defect in the vicinity of the interface using any method.

In this regard, in order to consider the electron state of the C defect in the SiC substrate, the electronic state of the C defect in the 4H-structure SiC and the 3C-structure SiC is obtained through a first principle calculation. FIG. 1 is a diagram illustrating a C defect state density in the 4H-structure SiC. As the C defect is generated in the substrate, each of four Si atoms around the C defect has a single dangling bond. The dangling bond of Si has an energy state in the vicinity of the middle of the bandgap of SiC. Therefore, the dangling bonds of the four Si molecules around the C defect interact with each other, and a bonding state or an anti-bonding state is separately generated in the gap. However, in the SiC structure, the energy positions of the conduction band and the valence band are changed. Therefore, a positional relationship between the bonding state and the anti-bonding state in the gap, generated by the interaction of the dangling bond of Si, depends on the structure of SiC.

As illustrated in FIG. 1, in the 4H structure, the anti-bonding state is generated immediately under the conduction band. In this state, electrons are trapped so as to degrade the mobility.

The embodiments described herein have been made to address such problems and provide a technology of making a low-resistance contact with both the n-type SiC region and the p-type SiC region in a single electrode and an SiC semiconductor device using the same. Furthermore, the embodiments has been made to remove irregular distribution of the electric current between device cells and improve reliability as a device by uniformizing the in-plane distribution of the electric current passing through the metal/SiC interface.

It was recognized that the Si surface becomes the outermost surface in both the Si surface and the C surface of the 4H-structure SiC substrate through the first principle calculation. In the Si surface, Si has a single dangling bond, and this structure is well known in the art. In order to remove C in the lower layer, energy of 2 eV or higher is necessary even in a single layer below, and energy of 4 eV or higher is necessary internally. In the related art, it was conceived that the C surface is stable when the C has a single dangling bond. However, it was recognized for the first time in this investigation that the C on the outermost surface is easily dropped, and the outermost surface is Si of the lower layer. Similarly, it was also recognized that the C of the outermost surface is dropped also in the (11-20) plane (A surface).

The electronic state when the C is adsorbed to the Si of the outermost surface was investigated. It was recognized that it is possible to make a localized state originated from the dangling bond of the C adsorbed to the top of the valence band. This can be applied to any of the C surface, the Si surface, and the A surface. It was revealed that the p-type low-resistance contact can be obtained by the C adsorption.

In order to analyze a defect generation mechanism in the vicinity of the substrate surface, the defect generation energy on the SiC substrate surface was obtained based on the first principle calculation. The energy necessary to generate the C defect on the outermost surface of the C surface of the SiC substrate was 0.75 eV, and the energy necessary to generate the Si defect of the outermost surface of the Si surface of the SiC substrate was 4.6 eV. Since the element of the outermost surface of the SiC substrate obtained at the hydrogen termination has a dangling bond, it is recognized that the element can be easily dropped in a high energy state and generate a defect.

Then, the defect generation energy in the SiC substrate was obtained by the first principle calculation. It was recognized that the energy necessary to generate the C defect is 4.0 eV, the energy necessary to generate the Si defect is 7.5 eV, and the C defect is most easily generated in the SiC substrate.

In the vicinity of the metal/SiC substrate interface and in the vicinity of the $SiO_2$ insulation film/SiC substrate interface, internal elements (C and Si) and defects generated in the surface are replaced and diffused. As a result, it was recognized that a lot of defects are generated in the SiC substrate in the vicinity of the metal/SiC substrate interface and the vicinity of the $SiO_2$ insulation film/SiC substrate interface.

As recognized from the energy for generating the C defect and the Si defect, a large amount of C defects are generated by introducing dopants and the like through ion implantation.

In either case, it is considered that the C defects are generated at a concentration of at least $10^{17}/cm^3$ or higher using a typical MOSFET manufacturing process. In many cases, the C defects may be generated at a concentration of $10^{18}/cm^3$.

As a result, it was recognized that a lot of interface C defects are generated in the vicinity of the metal/SiC substrate interface and the vicinity of the $SiO_2$ insulation film/SiC substrate interface, and the current passing through the electrode varies in the 4H type SiC substrate MOSFET.

In the epi-SiC substrate, it was recognized that although the C defects are generated at a concentration of $10^{13}/cm^3$ order, the concentration of the C defects abruptly increases if ions such as dopants are implanted. Even in a low dose, the concentration reaches $1\times10^{17}/cm^3$. That is, in a high dose, the concentration easily reaches $10^{18}/cm^3$.

In an actual 4H-structure substrate MOSFET, there are many reports regarding the interfacial state having a concentration of $1\times10^{18}$/cm$^3$ or higher. Since 4 electrons are accessible to the C defect in the substrate at maximum, this corresponds to the C defect amount of $2.5\times10^{17}$/cm$^3$ or higher. For example, the interfacial states are distributed at a concentration equal to or higher than $8.9\times10^{16}$/cm$^3$ (corresponding to a surface density of $2\times10^{11}$/cm$^2$) and equal to or lower than $8.9\times10^{19}$/cm$^3$ (corresponding to a surface density of $2\times10^{13}$/cm$^2$). This corresponds to the C defect amount equal to or higher than $2.2\times10^{16}$/cm$^3$ and equal to or lower than $2.3\times10^{19}$/cm$^3$. However, it is anticipated that the C defect amount be equal to or lower than $8.9\times10^{19}$/cm$^3$ as a maximum value. The C defect amount also depends on the SiO$_2$ film manufacturing. The C defect is similarly generated by the SiO$_2$ film manufacturing, the SiO$_2$ exfoliation, and the electrode metal film manufacturing (such as Ni, Ti, and Al).

As apparent from the aforementioned description, it is preferable that the amount of C defects be equal to or higher than $2.2\times10^{16}$/cm$^3$ and equal to or lower than $8.9\times10^{19}$/cm$^3$. In a more preferable process, the amount of C defects can be suppressed to be equal to or higher than $2.2\times10^{16}$/cm$^3$ and equal to or lower than $2.2\times10^{19}$/cm$^3$.

Through a diligent study of the aforementioned description, it was recognized that, in a semiconductor device in which a first electrode obtained by using a conductive material is connected to an SiC semiconductor device including a p-type first silicon carbide (SiC) semiconductor section formed on the SiC semiconductor substrate and an n-type second SiC semiconductor section, a low-resistance contact is obtained between the n-type SiC (aforementioned second SiC semiconductor section), the p-type SiC (aforementioned first SiC semiconductor section), and the metal (aforementioned first electrode) by making the surface density of C be a peak at an interface between the first electrode and the p-type first SiC semiconductor section connected to the first electrode. In addition, a low-resistance contact between the n-type SiC, the p-type SiC, and the metal is obtained using the same electrode. Furthermore, it was also determined that dependence on the metal is insignificant, and an n-type dedicated electrode (typically, Ni) that has been used in the related art may be used, since pinning at the interface is used at the contact with the p-type SiC.

In addition, since the in-plane distribution of the electric current passing through the metal/SiC interface is uniformized, the electric current distribution between device cells is removed, and reliability as a device is improved. That is, it was conceived that a mode in which a large electric current locally flows and generates breakdown is removed.

The semiconductor device according to the present embodiment includes a first electrode obtained by using a conductive material; a p-type first silicon carbide (SiC) semiconductor section connected to the first electrode, the first SiC semiconductor section containing C such that the surface density distribution has a peak at a first interface with the first electrode; and an n-type second SiC semiconductor section connected to the first electrode.

In the semiconductor device according to the aforementioned embodiment, it is preferable that the n-type second SiC semiconductor section contains at least one of elements selected from a group including nitrogen (N), phosphorous (P), and arsenic (As) such that a surface density thereof has a peak at a second interface with the first electrode.

In the semiconductor device according to the embodiment described above, it is preferable that carbon at the first interface be equal to or smaller than a single monolayer, and at least one element selected from a group including nitrogen, phosphorous, and arsenic of the second interface be equal to or smaller than a single monolayer.

Here, the "monolayer" means a structure in which only a single atom is provided in a direction perpendicular to the surface. For example, the monolayer may have a structure in which a single C atom is bonded to a part of the Si crystal structure on the outermost surface of the Si surface of 4H—SiC. In addition, the monolayer may have a structure in which a part of Si of the outermost surface is substituted with nitrogen.

For the surface density of the interfacial atoms, the surface density of the element on the outermost surface of 4H—SiC is set to $2.4\times10^{15}$/cm$^2$. An effect can be obtained if C piles up in 5% or more of elements of the outermost surface. In addition, the monolayer is obtained at 50%. Furthermore, it is possible to reach 75%. That is, the effect can be obtained at a concentration equal to or higher than $1.2\times10^{14}$/cm$^2$ and equal to or lower than $1.8\times10^{15}$/cm$^2$. In addition, preferably, the concentration is equal to or higher than $1.2\times10^{14}$/cm$^2$ and equal to or lower than $1.2\times10^{15}$/cm$^2$.

In the semiconductor device of the embodiment described above, it is preferable that a concentration of carbon at the first interface be equal to or higher than $1.2\times10^{14}$/cm$^2$ and equal to or lower than $1.8\times10^{15}$/cm$^2$.

In the semiconductor device of the embodiment described above, a concentration of at least one element selected from a group including nitrogen, phosphorous, and arsenic at the second interface be equal to or higher than $1.2\times10^{14}$/cm$^2$ and equal to or lower than $1.8\times10^{15}$/cm$^2$.

According to another aspect, there is provided a method of manufacturing a semiconductor device, including: step 1 of providing an SiO$_2$/SiC structure; step 2 of introducing C (carbon) into a vicinity of an SiO$_2$/SiC interface after step 1; step 3 of forming a film of a conductive material by removing a part of SiO$_2$ after step 2; and step 4 of diffusing the C introduced in step 2 after step 3.

EXAMPLE 1

Hereinafter, Example 1 in which the aforementioned embodiment is applied to the DiMOSFET will be described with reference to the drawings.

Figure 2:
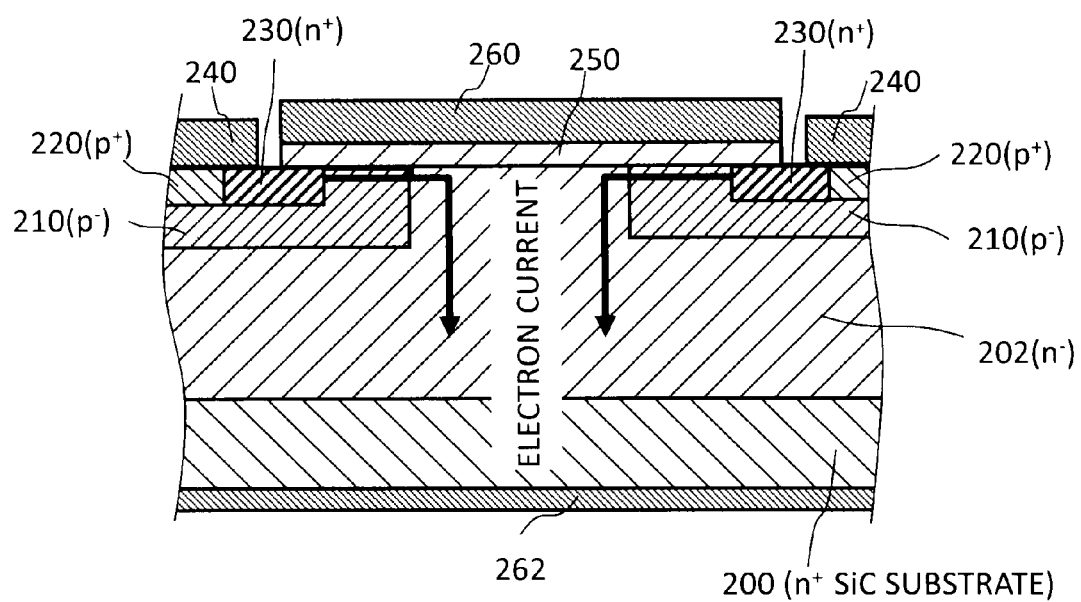
FIG. 2 is a cross-sectional view illustrating main parts of a semiconductor device according to Example 1.

FIG. 2 illustrates a cross-section of a double implanted metal oxide semiconductor field effect transistor (DiMOSFET) by way of example. In FIG. 2, a low-concentration n-type (n$^-$) SiC semiconductor layer 202 is formed and arranged on the surface of the high-concentration n-type (n$^+$) silicon carbide (SiC) semiconductor substrate 200. The (n$^-$) SiC semiconductor layer 202 has an impurity concentration lower than that of the (n$^+$) SiC semiconductor substrate 200. The (n$^-$) SiC semiconductor layer 202 serves as a withstanding voltage maintaining layer. The (n$^+$) SiC semiconductor substrate 200 is an exemplary n-type silicon carbide (SiC) semiconductor section.

In addition, an electrode 262 made of a conductive material is connected and arranged in the rear surface of the (n$^+$) SiC semiconductor substrate 200. The electrode 262 serves as a drain electrode. The electrode 262 serves as an example of the third electrode or an example of the second electrode. In this case, the (n$^+$) SiC semiconductor substrate 200 contains at least one of elements selected from a group including nitrogen (N), phosphorous (P), and arsenic (As) such that a surface density thereof has a peak at an interface with the electrode 262. The electrode 262 makes an ohmic contact with the rear surface of the (n$^+$) SiC semiconductor substrate 200.

A plurality of low-concentration p-type (p$^-$) SiC semiconductor regions 210 having a predetermined film thickness are selectively formed and arranged on a part of the surface of the (n⁻) SiC semiconductor layer 202 with an interval from the surface of the (n–) SiC semiconductor layer 202 to the internal intermediate depth. The (p⁻) SiC semiconductor region 210 serves as an example of the third semiconductor section. A single semiconductor device includes two p-type (p⁻) SiC semiconductor regions 210 by interposing the area of the (n⁻) SiC semiconductor layer 202. The high-concentration n-type (n⁺) SiC semiconductor region 230 is selectively formed and arranged on a part of the surface of each (p⁻) SiC semiconductor region 210 with a predetermined film thickness from the surface of the (p⁻) SiC semiconductor region 210 to the internal intermediate depth. In addition, the p-type (p⁺) SiC semiconductor region 220 is arranged adjacently to the n-type (n⁺) SiC semiconductor region 230 on a part of the surface of each (p⁻) SiC semiconductor region 210. In this manner, a plurality of p-type (p⁻) SiC semiconductor regions 210 are selectively formed on at least a part of the (n⁻) SiC semiconductor layer 202 and are connected to the n-type (n⁺) SiC semiconductor region 230 and the p-type (p⁺) SiC semiconductor region 220. In the example of FIG. 1, a single n-type (n⁺) SiC semiconductor region 230 and a single p-type (p⁺) SiC semiconductor region 220 neighboring each other are arranged in a part of the surface of each (p⁻) SiC semiconductor region 210. In addition, when a single semiconductor device is formed, two p-type (p⁺) SiC semiconductor regions 220 are arranged to interpose two n-type (n⁺) SiC semiconductor regions 230. In other words, in a single semiconductor device, the p-type (p⁺) SiC semiconductor region 220 is arranged in an outer side of the n-type (n⁺) SiC semiconductor region 230. In addition, in each (p⁻) SiC semiconductor region 210, a channel region electrically conducting to the (n⁻) SiC semiconductor layer 202 is formed internally from each n-type (n⁺) SiC semiconductor region 230.

The insulation film 250 is formed across a part of the surfaces of two n-type (n⁺) SiC semiconductor region 230. As the insulation film 250, for example, an SiO₂ oxide film is used. The insulation film 250 adjoins the surfaces of both n-type (n+) SiC semiconductor regions 230, the surfaces of each (p⁻) SiC semiconductor region 210 where n-type (n⁺) SiC semiconductor region 230 and the p-type (p⁺) SiC semiconductor region 220 are not formed, and the surface of the (n⁻) SiC semiconductor layer 202 serving as an inter-channel region between two (p⁻) SiC semiconductor regions 210. The electrode 260 is formed over the insulation film 250. The insulation film 250 is an example of the gate insulation film. Therefore, the electrode 260 is formed through the insulation film 250 across both n-type (n⁺) SiC semiconductor regions 230, a partial area of the (p⁻) SiC semiconductor region 210 where n-type (n⁺) SiC semiconductor region 230 and the p-type (p⁺) SiC semiconductor region 220 are not formed, and the (n⁻) SiC semiconductor layer 202 serving as an inter-channel region between two (p⁻) SiC semiconductor regions 210. The electrode 260 serves as the gate electrode. The electrode 260 is an example of the second electrode.

In addition, the electrode 240 is formed on another part of the surface of the n-type (n⁺) SiC semiconductor region 230 and the surface of the p-type (p⁺) SiC semiconductor region 220. The electrode 240 serves as the source electrode. The electrode 240 is another example of the first electrode.

Here, the p-type (p⁺) SiC semiconductor region 220 contains carbon (C) such that a surface density thereof has a peak at an interface with the electrode 240. The electrode 240 makes ohmic contact with the p-type (p⁺) SiC semiconductor region 220. Such a p-type (p⁺) SiC semiconductor region 220 corresponds to the substrate contact area in a MOS technique.

The p-type (p⁺) SiC semiconductor region 220 is an example of the first SiC semiconductor section (P contact).

If carbon can be introduced into the interface, it is possible to make a localized state in the vicinity of the top of the valence band. This can be implemented by (1) introducing extra carbon into the vicinity of the interface and (2) connecting metal and diffusing C. After connecting the metal, electrons can move from the metal to the interface localized state, and the entire system can be stabilized by the movement. This stabilized energy is a motive force of carbon pile-up at the interface. Here, since it is difficult to move electrons if the metal is not connected, it is difficult to gather carbon on the surface. That is, it is not sufficient if only extra carbon exists. Instead, it is necessary that extra carbon exist, metal be connected, and then, carbon be diffused and annealed. The annealing for diffusing carbon has stabilization energy caused by the electron movement described above. Therefore, it can be accomplished at a low temperature of 700° C. or lower. As a result, it is possible to form a (p⁺) SiC/electrode interface with a low contact resistance using a low-temperature process.

Meanwhile, the n-type (n⁺) SiC semiconductor region 230 contains at least one element selected from a group including nitrogen (N), phosphorous (P), and arsenic (As) such that a surface density thereof has a peak at an interface with the electrode 240. The electrode 240 makes ohmic contact with the n-type (n⁺) SiC semiconductor region 230. Such an n-type (n⁺) SiC semiconductor region 230 serves as a source region in the MOS device. The n-type (n⁺) SiC semiconductor region 230 is an example of the SiC semiconductor section or the second SiC semiconductor section (N contact).

The interfacial state can be terminated if at least one element selected from a group including nitrogen, phosphorous, and arsenic can be introduced into the interface. Such an element is sufficiently introduced into the n-type (n⁺) SiC semiconductor region 230 and activated at a high temperature. Then, if carbon is ion-implanted into the n-type (n⁺) SiC semiconductor region 230, a part of the n-type dopants such as of nitrogen, phosphorous, or arsenic can be jumped out between lattices and diffused again. If the electrode 240 is formed on the n-type (n⁺) SiC semiconductor region 230 of this state, and then a low-temperature annealing is performed (at a temperature of approximately 700° C. or lower), nitrogen, phosphorous, and arsenic is diffused in the vicinity of the interface so that a density increases. The high-temperature activation annealing is performed before the electrode is manufactured. In this case, the most dopants are not diffused. However, after the electrode is manufactured, electrons can move in the substrate, and dopants can be concentrated on the vicinity of the interface. The reason of this is because electrons can be exchanged between dopants in the vicinity of the interface and the electrode. As a result, it is possible to make an n⁺ type state at a higher concentration in the vicinity of the interface. In this case, the effective work function of the electrode is moved toward the bottom of the conduction band. A high concentration of dopants is obtained at the interface, and the interfacial dipoles are formed at the same time.

Furthermore, the dangling bond at the interface can be terminated at nitrogen, phosphorous, or arsenic. In the related art, since the annealing is performed before the electrode is manufactured, and dopants are provided at the lattice point, they are not diffused to the interface. However, in this case, since a significant amount of nitrogen, phosphorous, and arsenic is diffused to the vicinity of the interface, the interfacial termination can be obtained. As a result, it is possible to reliably remove the dangling bond at the interface. In this case, pinning in the dangling bond at the interface is released.

As apparent from the aforementioned description, it is possible to form the ($n^+$) SiC/electrode interface having a low contact resistance using a low-temperature process.

According to the present embodiment, carbon is introduced into the p-type ($p^{30}$) SiC semiconductor region 220 and the n-type ($n^+$) SiC semiconductor region 230 through ion implantation. As a result, it is possible to bury the carbon defects that were distributed abundantly. The carbon defect forms a localized state in the middle of a gap and accordingly generates a large in-plane distribution in a contact resistance. According to the method of the present embodiment, it is possible to address a problem of the in-plane distribution.

As described above, it is possible to lower the resistances in both the n-type and the p-type by containing an "interface additive element" for each of the n-type SiC and the p-type SiC such that a surface density distribution has a peak at an interface with the electrode. In addition, it is possible to form an electrode using a single kind of metal simultaneously on the n-type ($n^+$) SiC semiconductor region 230 and the p-type (p+) SiC semiconductor region 220. According to the first embodiment, it is possible to lower all of a resistance of the junction between the n-type ($n^+$) SiC semiconductor region 230 and the electrode 240 serving as a source electrode, a resistance of the junction between the p-type ($p^+$) SiC semiconductor region 220 and the electrode 240 serving as a source electrode, and a resistance of the junction between the rear surface of the ($n^+$) SiC semiconductor substrate 200 and the electrode 262 serving as a drain electrode. Alternatively, without limiting thereto, it is possible to lower only one or two out of a resistance of the junction between the n-type ($n^+$) SiC semiconductor region 230 and the electrode 240 serving as a source electrode, a resistance of the junction between the p-type ($p^+$) SiC semiconductor region 220 and the electrode 240 serving as a source electrode, and a resistance of the junction between the rear surface of the ($n^+$) SiC semiconductor substrate 200 and the electrode 262 serving as a drain electrode.

In the future, as a pattern miniaturization advances, it is necessary to provide a contact of the same metal in both the n-type SiC region and the p-type SiC region in a single SiC element. If a contact is provided using the same metal in both the n-type SiC region and the p-type SiC region, it is desirable to form a dual low-resistance contact from the viewpoint of restriction of the junction accuracy or process simplification. In other words, it is preferable to provide a technology that makes a low-resistance contact on both the n-type SiC region and the p-type SiC region in a single electrode. If it is difficult to implement such a low resistance, the on-resistance increases in the n-type SiC region. Meanwhile, since a resistance and a capacitance are effectively formed in the p-type SiC region, a switching speed may be degraded. If the contact resistance to the p-type SiC region is large, the RC time constant increases when the device is driven. Therefore, an operational speed is delayed. For these disadvantages, according to the first embodiment, a contact may be formed using the same metal in both the n-type SiC region and the p-type SiC region. In addition, a dual low-resistance contact may be formed. Therefore, it is possible to lower the on-resistance in the n-type SiC region. Meanwhile, it is possible to increase the switching speed in the p-type SiC region.

As described above, when the technology of the present embodiment is used, the contact forming temperature may be set to approximately 700° C. As a result, it is possible to perform the process without harming the SiC/insulation film interface. Such a low-temperature process improves the characteristics.

Manufacturing Method

Figure 3:
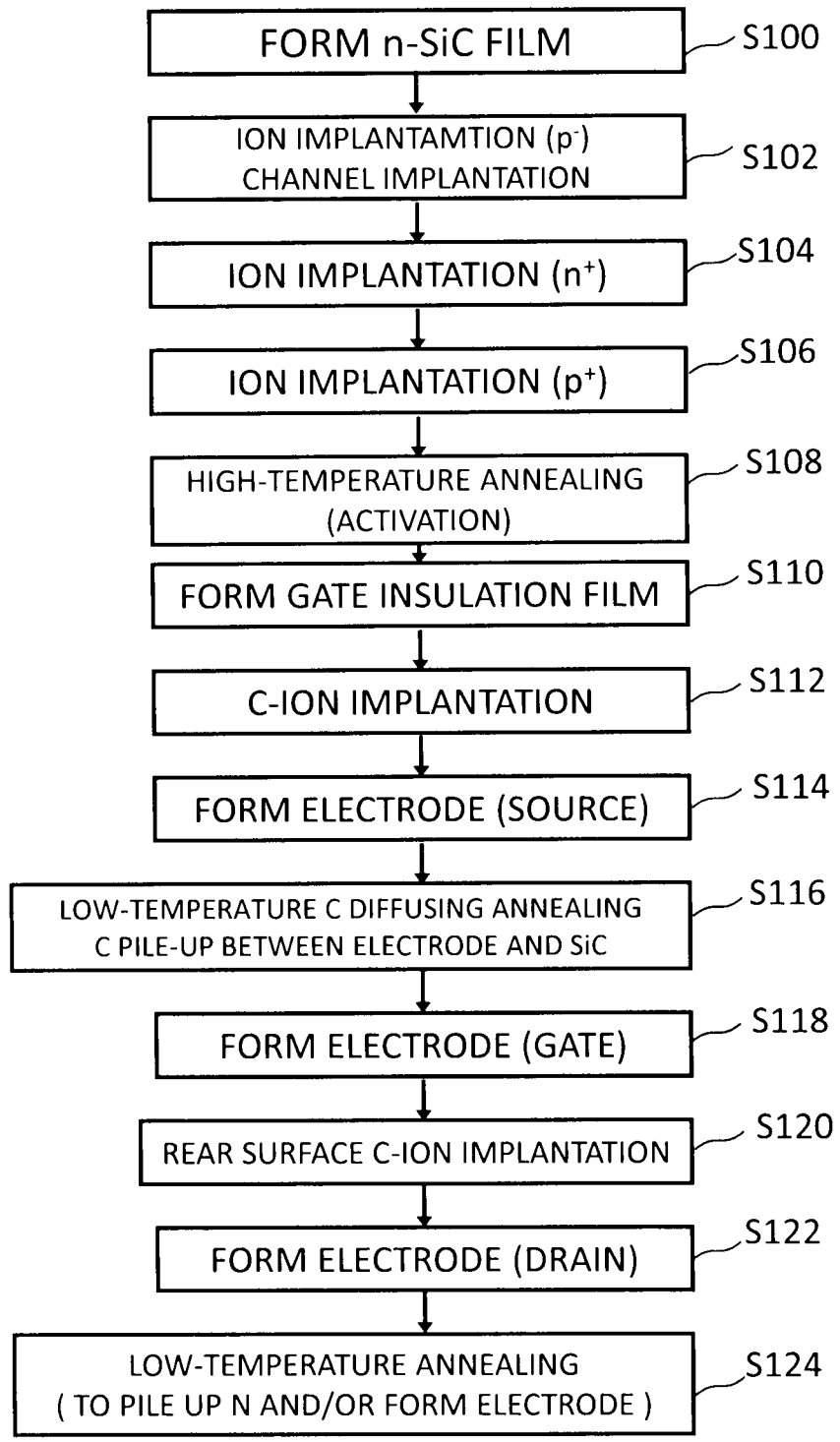
FIG. 3 is a flowchart illustrating a process of manufacturing the semiconductor device according to Example 1.

FIG. 3 is a flowchart illustrating a main process of manufacturing the semiconductor device according to Example 1. In FIG. 3, the method of manufacturing the semiconductor device according to Example 1 includes: an ($n^-$) SiC film forming process S100; a ($p^-$) ion implantation process S102; an ($n^+$) ion implantation process S104; a ($p^+$) ion implantation process S106; an activation high-temperature annealing process S108; an insulation film forming process S110; a carbon ion implantation process S112; an electrode (source electrode) forming process S114; a low-temperature annealing process for forming an interface S116; an electrode (gate electrode) forming process S118; a rear surface C ion implantation process S120; an electrode (drain electrode) forming process S122; and an annealing process S124.

FIGS. 4A to 5B are process cross-sectional views illustrating processes corresponding to the flowchart of a method of manufacturing the semiconductor device according to Example 1. FIGS. 4A to 5B illustrate processes from the ($n^-$) SiC film forming process S100 of FIG. 3 to the ion implantation process S106. The subsequent processes will be described below.

Figure 4A:
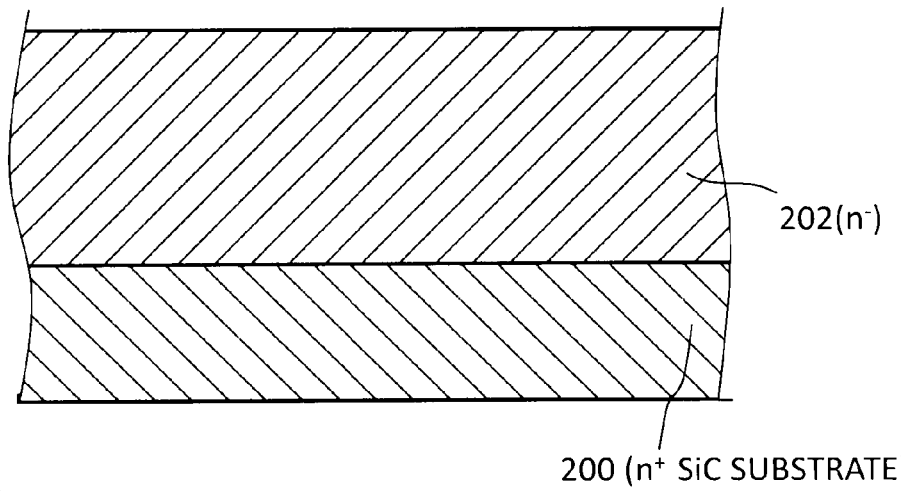
FIGS. 4A and 4B are cross-sectional views illustrating a process of manufacturing the semiconductor device according to Example 1.

Referring to FIG. 4A, in the ($n^-$) SiC film forming process S100, the ($n^-$) SiC semiconductor layer 202 is formed on the surface of the ($n^+$) SiC semiconductor substrate 200. As the ($n^+$) SiC semiconductor substrate 200, for example, a solid-state single-crystalline SiC substrate is used. It is preferable that the impurity concentration (doping concentration) of the ($n^+$) SiC semiconductor substrate 200 be equal to or higher than $1\times10^{16}$ atoms/cm$^3$ and lower than $1\times10^{20}$ atoms/cm$^3$. Here, for example, impurity concentration is set to $6\times10^{17}$ atoms/cm$^3$. In the following examples, unless specified otherwise, it is assumed that a substrate having a substrate concentration of $6\times10^{17}$ atoms/cm$^3$ is used regardless of the conduction type (p-type or n-type). As the ($n^+$) SiC semiconductor substrate 200, a hexagonal crystalline SiC substrate (4H—SiC substrate) having a crystal surface (0001) is preferable. In addition, ($n^-$) SiC semiconductor layer 202 is formed by epitaxially growing the ($n^-$) SiC film on the surface of the ($n^+$) SiC semiconductor substrate 200 through an epitaxial vapor-phase growth technique.

When the epitaxial layer is formed, for example, $SiH_4$ or $C_3H_8$ gases may be used as a source material gas. In addition, as the impurity (dopant), nitrogen (N), phosphorous (P), or arsenic (As) may be used. The ($n^-$) SiC semiconductor layer 202 serves as a withstanding voltage maintaining layer. It is preferable that the ($n^-$) SiC semiconductor layer 202 have a thickness, for example, equal to or larger than 0.5 μm and equal to or smaller than 20 μm. Here, the ($n^-$) SiC semiconductor layer 202 has a thickness of, for example, 10 μm. In addition, it is preferable that the impurity concentration (doping concentration) of the ($n^-$) SiC semiconductor layer 202 be equal to or higher than $8\times10^{14}$ atoms/cm$^3$ and lower than $3\times10^{17}$ atoms/cm$^3$. Here, the impurity concentration of the ($n^-$) SiC semiconductor layer 202 is set to, for example, $5\times10^{15}$ atoms/cm$^3$. In the following examples, unless specified otherwise, it is assumed that the concentration of the ($n^-$) SiC is set to $5\times10^{16}$ atoms/cm$^3$.

Figure 4B:
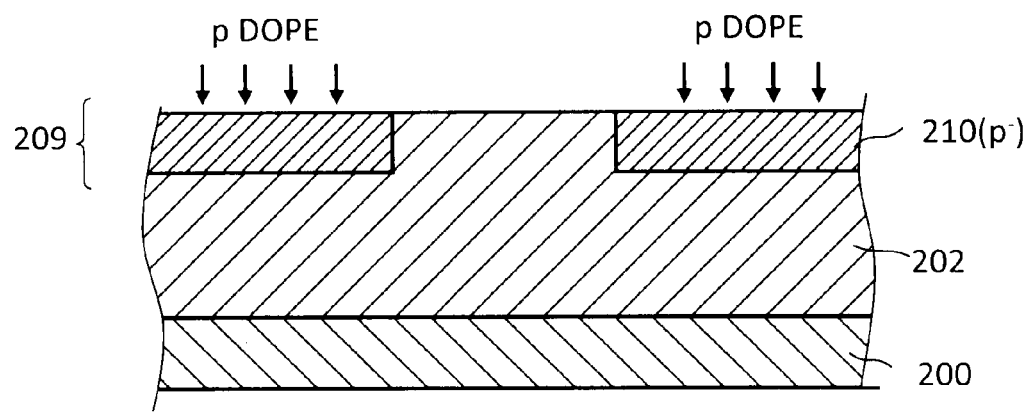

Referring to FIG. 4B, in the ($p^-$) ion implantation process S102, the p-type impurities are selectively implanted into the ($n^-$) SiC semiconductor layer 202 by using the oxide film formed by photolithography and etching as a mask so as to form the ($p^-$) SiC semiconductor region 210. The concentration of the conductive impurities in the ($p^-$) SiC semiconductor region 210 may be set to, for example, $1\times10^{16}$/cm$^3$. In the following examples, unless specified otherwise, it is assumed that the concentration of (p⁻) SiC is set to $1\times10^{16}$ atoms/cm³. The condition of implanting Al ions serving as a p-type impurity may be set to, for example, $1\times10^{16}/cm^2$ and 80 KeV. Here, the substrate is heated to a temperature of 300° C. It is preferable that the concentration of the conductive impurities in the (p⁻) SiC semiconductor region 210 be equal to or higher than $1\times10^{13}/cm^3$ and equal to or lower than $5\times10^{17}/cm^2$. More preferably, the concentration of the conductive impurities in the (p⁻) SiC semiconductor region 210 is equal to or higher than $1\times10^{15}/cm^3$ and equal to or lower than $5\times10^{16}/cm^3$.

Figure 5A:
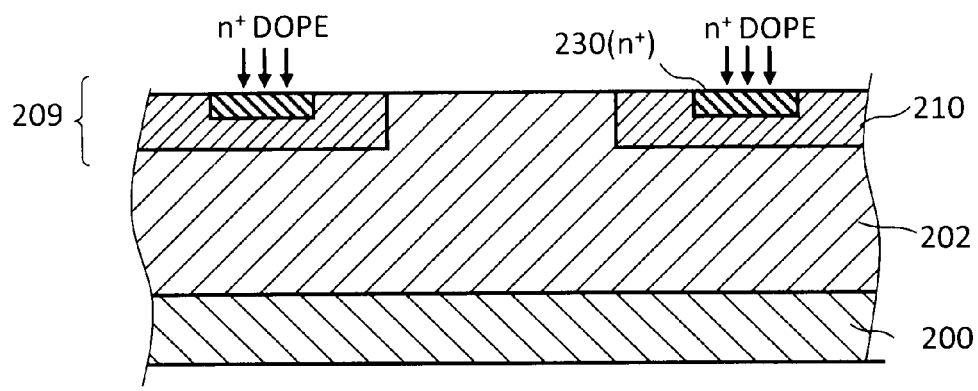
FIGS. 5A and 5B are cross-sectional views illustrating a process of manufacturing the semiconductor device according to Example 1.

Referring to FIG. 5A, in the (n⁺) ion implantation process S104, the (n⁺) SiC semiconductor region 230 is formed by selectively implanting the n-type conductive impurities into a part of the surface of the (p⁻) SiC semiconductor region 210.

Figure 5B:
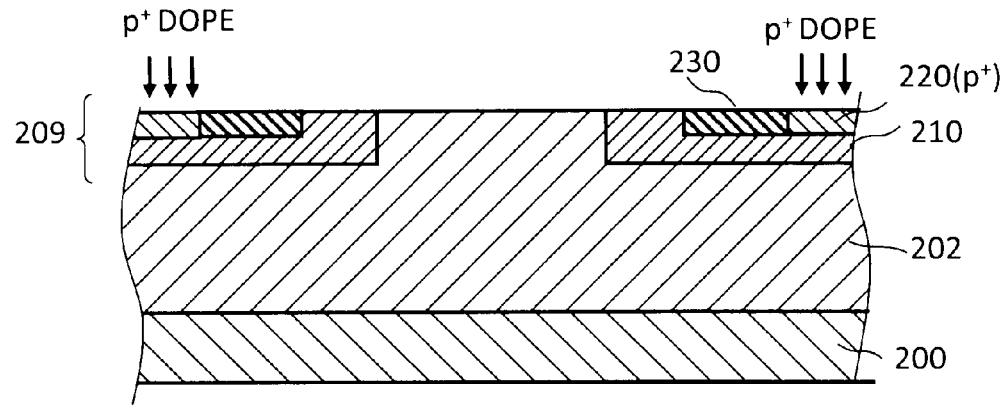

Referring to FIG. 5B, in the (p⁺) ion implantation process S106, the (p⁺) SiC semiconductor region 220 is formed by selectively implanting the p-type conductive impurities into another part of the surface of the (p⁻) SiC semiconductor region 210 so as to be adjacent to the (n⁺) SiC semiconductor region 230. After removing the mask 222 of the oxide film used to form the (n⁺) SiC semiconductor region 230, a mask 232 of the oxide film having a new pattern is formed again through photolithography and etching. In addition, the (p⁺) SiC semiconductor region 220 is formed by implanting the p-type conductive impurities through the opening of the new mask 232. The concentration of the conductive impurities in the (p⁺) SiC semiconductor region 220 may be set to, for example, $5\times10^{16}/cm^2$. The condition of implanting the aluminum (Al) ions serving as the p-type impurities may be set to, for example, $1\times10^{15}/cm^2$ and 40 KeV. Here, the substrate is heated to a temperature of 300° C. It is preferable that the concentration of the conductive impurities in the (p⁺) SiC semiconductor region 220 be equal to or higher than $1\times10^{14}/cm^2$ and equal to or lower than $1\times10^{18}/cm^2$. More preferably, the concentration of the conductive impurities in the (p⁺) SiC semiconductor region 220 is equal to or higher than $5\times10^{15}/cm^2$ and equal to or lower than $5\times10^{17}/cm^2$.

In a high-temperature annealing process S108, an activation annealing process is performed after the aforementioned implantation process. In this activation annealing process, for example, a condition may be set such that a heat temperature is 1600° C. and a heating time is 30 minutes by using an argon (Ar) gas as an atmospheric gas. In this manner, the structure illustrated in FIG. 5B can be obtained. In this case, although the dopants introduced into the inner side of SiC can be activated, most of them are not diffused.

Figure 6:
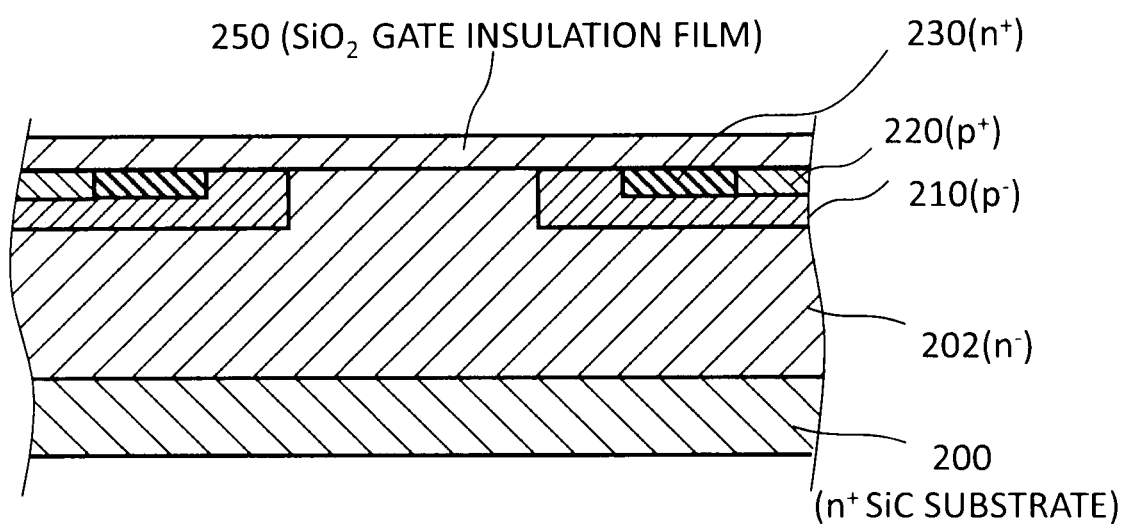
FIG. 6 is a cross-sectional view illustrating a process of manufacturing the semiconductor device according to Example 1.
Figure 7:
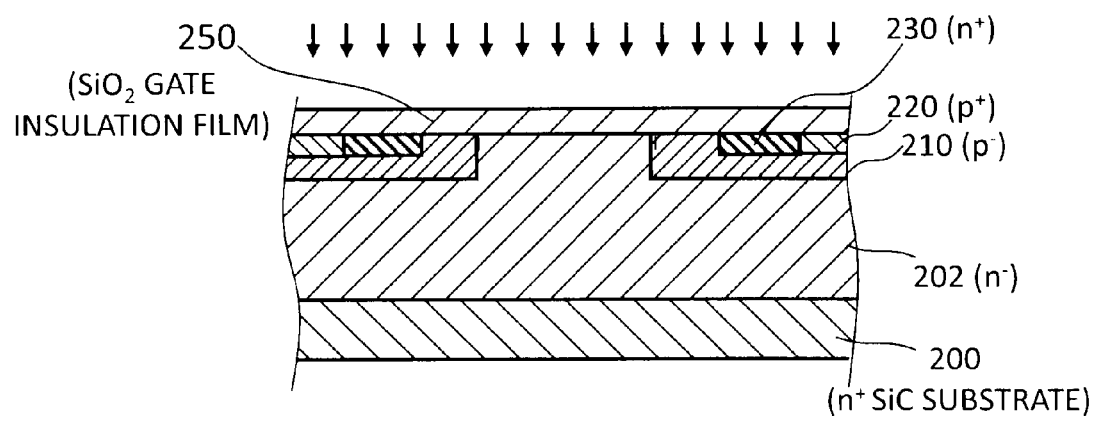
FIG. 7 is a cross-sectional view illustrating a process of manufacturing the semiconductor device according to Example 1.

FIGS. 6 and 7 are process cross-sectional diagrams illustrating processes corresponding to the flow chart of a method of manufacturing the semiconductor device according to the first embodiment. FIGS. 6 and 7 illustrate processes from the insulation film forming process S110 of the flowchart of FIG. 3 to the electrode (gate electrode) forming process S118. The subsequent processes will be described below.

Referring to FIG. 6, in the insulation film forming process S110, the oxide film 250 is formed to cover all of the (n⁻) SiC semiconductor layer 202, the (p⁻) SiC semiconductor region 210, the (p⁺) SiC semiconductor region 220, and the (n⁺) SiC semiconductor region 230. As a method of forming the oxide film 250, for example, dry oxidation (thermal oxidation) may be performed. For example, a precise oxide film may be formed through dry oxidation under a condition that a heating temperature is set to 1200° C., and a heating time is set to 30 minutes. Alternatively, an SiO₂ film may be formed through a CVD technique and the like.

Then, as illustrated in FIG. 7, carbon ions are implanted into the entire surface of the substrate. The object of this process is to implant carbon ions into the vicinity of the interface of the (p⁺) SiC semiconductor region 220 and the (n⁺) SiC semiconductor region 230 with the insulation film 250. The condition for implanting carbon ions may be set to, for example, $1\times10^{13}/cm^2$ and 80 KeV. In this step, it is preferable that the concentration of carbon be equal to or higher than $1\times10^{13}/cm^3$ and equal to or lower than $5\times10^{17}/cm^3$. More preferably, the concentration of carbon is equal to or higher than $1\times10^{15}/cm^3$ and equal to or lower than $5\times10^{16}/cm^3$.

Figure 8A:
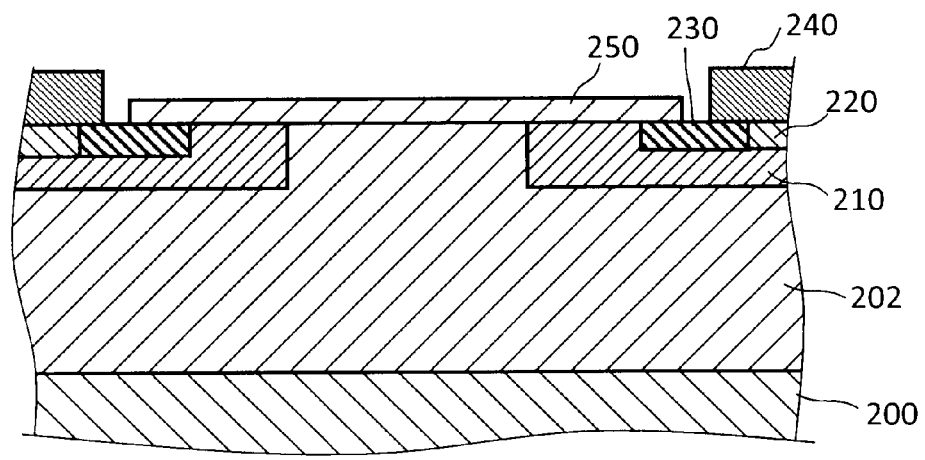
FIGS. 8A and 8B are cross-sectional views illustrating a process of manufacturing the semiconductor device according to Example 1.

Then, as illustrated in FIG. 8A, first, a resist film having a pattern is formed on the oxide film 250 using photolithography. By using the resist film as a mask, a part of the oxide film 250 positioned in a part of the surface of the (p⁺) SiC semiconductor region 220 and the surface of the (n⁺) SiC semiconductor region 230 is removed through etching. As a result, it is possible to form an oxide film 250 across both the (n⁺) SiC semiconductor regions 230.

Then, in the electrode (source electrode) forming process S114, a conductive film including metal and the like is formed on a part of the surface of the (p⁺) SiC semiconductor region 220 and the surface of the (n⁺) SiC semiconductor region 230 exposed by the opening formed by removing the resist film and the oxide film 250. Such a conductive film becomes an electrode 240. Then, by removing the resist film, the conductive film positioned on the resist film is removed (lift-off). In addition, if the width of the oxide film 250 is narrowed by an etch-back technique and the like, a gap may be formed to prevent the oxide film 250 and the electrode 240 from making contact.

Here, as a conductive material of the electrode 240, for example, nickel (Ni) or a titanium nitride (TiN) is preferably used. In the related art, there is a significant limitation for this electrode in the type or the manufacturing process. However, through the following heat treatment, the effective work function is pinned at approximately 4.2 eV in the n⁺ region and at approximately 7.2 eV in the p⁺ region. Therefore, it is recognized that a stable conductor may be used without limitation. Therefore, for example, other kinds of metal or materials other than metal having an excellent workability such as n-type polysilicon or n-type polysilicon carbide may be used.

As the low-temperature annealing process S116, a heat treatment is performed at a temperature of, for example, 400° C. after forming the source electrode. For example, the heating time is set to 5 minutes, and the argon (Ar) gas is used. Through such a heat treatment, nitrogen may be gathered (pile up) at an interface between the electrode 240 and the (n⁺) SiC semiconductor region 230, and carbon may be gathered (piled up) at an interface between the electrode 240 and the (p⁺) SiC semiconductor region 220. This is because the states of nitrogen and carbon are stabilized by the pile-up at the interface due to the exchange of electrons with the electrode. If the high-temperature annealing (for example, 1600° C. or 950° C.) is performed as in the related art after forming the oxide film 250 serving as the gate oxide film, the interface between the oxide film 250 and the channel region is deteriorated. However, according to the present embodiment, since it is possible to remarkably lower the heating temperature to 400° C., it is possible to prevent such deterioration. The interface deterioration is generated if the annealing temperature is equal to or lower than 700° C.

Figure 8B:
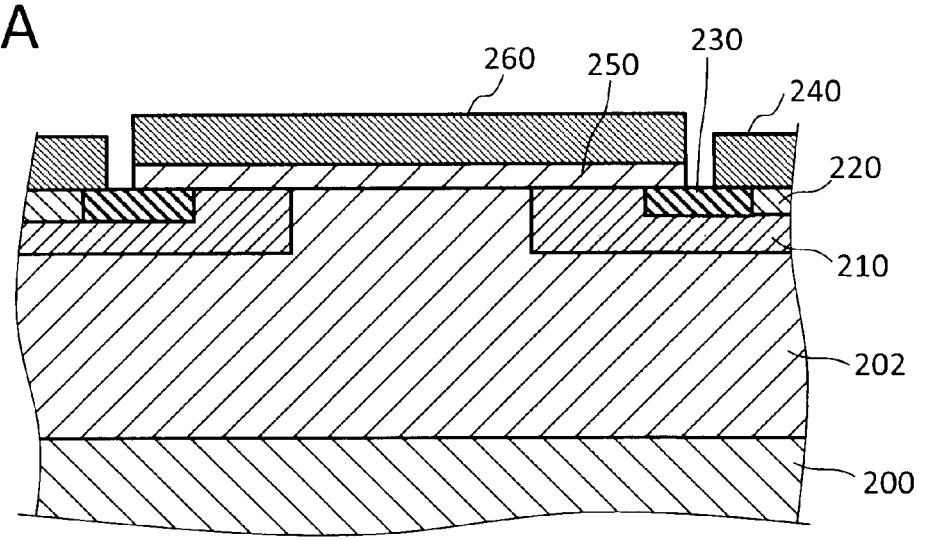

Referring to FIG. 8B, in the electrode (gate electrode) forming process S118, the electrode 260 serving as the gate electrode is formed on the oxide film 250 as a gate insulation film. For example, the electrode 260 is formed of n-type polysilicon and the like. In addition, the source electrode may also be made of n-type polysilicon. A Ni film may be further formed on the source electrode or the gate electrode, and a heat treatment may be performed to obtain a salicide (NiSi) film as an electrode.

Figure 9:
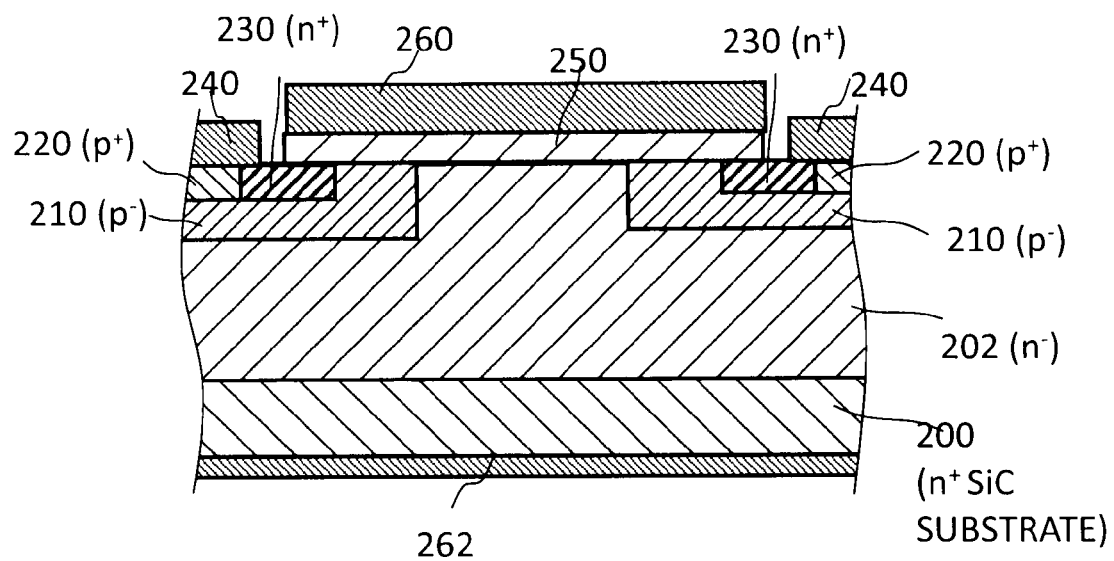
FIG. 9 is a cross-sectional view illustrating a process of manufacturing the semiconductor device according to Example 1.

FIG. 9 is a cross-sectional view after the processes corresponding to the flowchart of a method of manufacturing the semiconductor device according to the first embodiment. FIG. 9 is a cross-sectional view after the rear surface carbon ion implantation process S120, an electrode (drain electrode) forming process S122, and a low-temperature annealing process S124 are performed as illustrated in FIGS. 8A and 8B.

In order to form an interface between the rear surface and the electrode (drain electrode), the carbon ion implantation process S120 may be performed before the electrode (drain electrode) forming process S122. In this case, the annealing process S124 may be implemented at a low temperature (approximately, 700° C.)

Alternatively, the carbon ion implantation process S120 for forming an interface between the rear surface and the electrode (drain electrode) may be performed simultaneously with the carbon ion implantation process S112 described above. In this case, in order to simultaneously perform two annealing processes S116 and S124, the electrode forming processes S114, S120, and S122 are successively performed, and then, the low-temperature annealing is performed once.

In the electrode (drain electrode) forming process S122, the electrode 262 corresponding to the drain electrode is formed on the rear surface of the ($n^+$) SiC semiconductor substrate 200. In advance, the oxide film formed in the gate insulation film forming process S110 is removed. Here, if the electrode configuration of the related art, for example, the Ni electrode and the like is used for the rear surface electrode, it is necessary to perform a high-temperature process exceeding 800° C. In this regard, according to the first embodiment, carbon ions are implanted, and the low-temperature annealing is performed after forming the electrode. As a result, a method of piling up nitrogen serving as a pinning material at the interface is also used in the rear surface contact.

In the low-temperature annealing process S124, a heat treatment at 400° C. is performed. For example, the heat treatment is performed under an argon (Ar) gas atmosphere for a heating time of 5 minutes. In this heat treatment, it is possible to gather (pile up) nitrogen at the interface between the electrode 262 and the ($n^+$) SiC semiconductor substrate 200. In this case, in the vicinity of the interface, a thin NiSi is generated. However, nitrogen is piled up at the interface with SiC, and the effective work function becomes 4.2 eV so as to make ohmic contact.

Figure 10A:
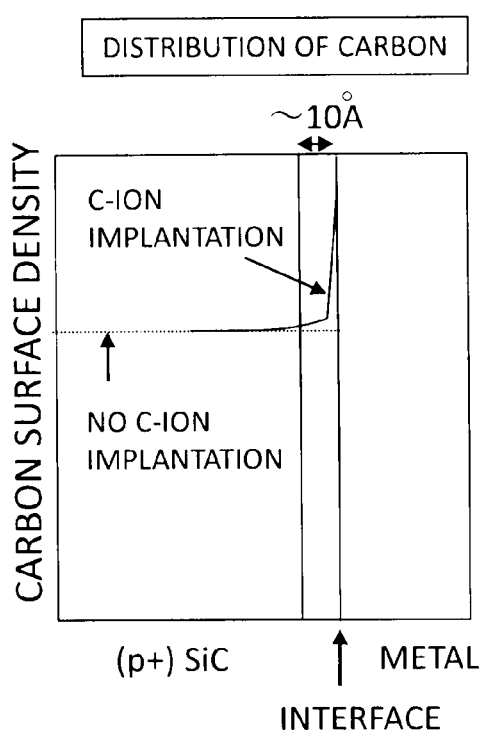
FIGS. 10A and 10B are diagrams illustrating the effect of Example 1.

The graph of FIG. 10A illustrates an exemplary surface density distribution of carbon at the interface between the electrode and the ($p^+$) SiC according to the first embodiment, in which the ordinate denotes a carbon surface density, and the abscissa denotes a position. If there is no carbon ion implantation, the carbon surface density does not significantly change in the ($p^{30}$) SiC, and it is indicated by the dotted line. However, if the carbon ion implantation is performed, metal is connected, and the annealing is performed, it is recognized that a peak is exhibited at the interface. It is indicated by the solid line. It is recognized that a peak of carbon is exhibited within 10 angstroms from the interface between SiC and metal, that is, from the surface of the ($p^+$) SiC in this case. This peak is considered as a just interface.

Figure 10B:
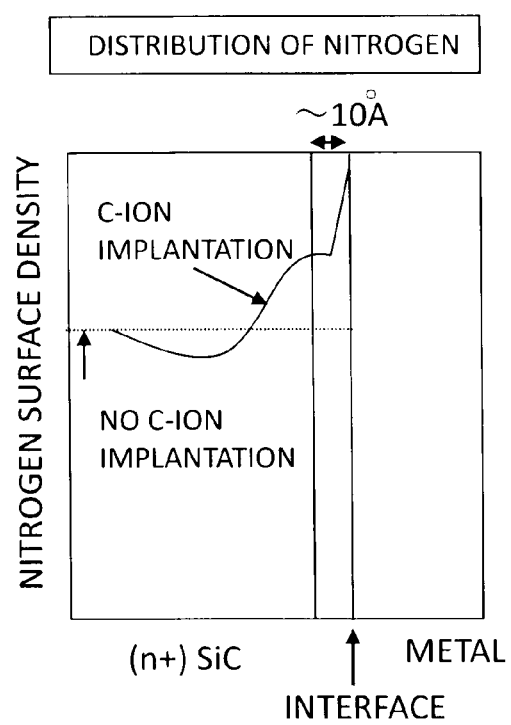

The graph of FIG. 10B illustrates an exemplary surface density distribution of nitrogen (or n-type dopants such as phosphorous and arsenic) at the interface between the electrode and the ($n^+$) SiC according to the first embodiment, in which the ordinate denotes a nitrogen surface density, and the abscissa denotes a position. If the carbon ion implantation is not performed, the nitrogen surface density in the ($p^+$) SiC is distributed according to the design. This example is indicated by the dotted line. However, it is recognized that a peak is exhibited in the nitride density at the interface if the carbon ion implantation is performed, metal is connected, and then, the annealing is performed. In addition, it is recognized that nitrogen immediately under the metal in the vicinity of the interface is moved toward the surface side from the inner side so that the nitrogen density immediately under the interface increases. This is indicated by the solid line. It is recognized that a peak of nitrogen is at the interface between ($n^+$) SiC and metal (in this case, within a thickness of 10 angstroms from the surface of the SiC).

Here, as the ($n^+$) SiC semiconductor substrate 200, for example, a 4H—SiC substrate having another principal surface such as a (000-1) plane may be used. That is, the reason is that the ohmic contact caused by nitrogen (or phosphorous or arsenic) piling up in the source electrode of the present example and the $n^+$ region and by carbon piling up in the source electrode and the p+ region is exhibited effective regardless of the orientation of the substrate. This may be similarly applied to the (11-20) plane and the like.

As described above, in Example 1, the ohmic contact is obtained by nitrogen, phosphorous, or arsenic piling up to the source electrode/$n^+$ region interface at a low temperature and carbon piling up to the source electrode/$p^+$ region interface at a low temperature. As a result, (1) it is recognized that the on-resistance at the source electrode/$n^+$ region interface can be significantly reduced in comparison with the related art. Although the target contact resistance is equal to or smaller than $1\times10^{-5}$ Ωcm$^2$, $1\times10^{-7}$ Ωcm$^2$ is implemented. (2) It is recognized that the contact resistance at the source electrode/$p^+$ region interface can be significantly lowered in comparison with the related art. Although the target contact resistance is equal to or lower than $1\times10^{-3}$ Ωcm$^2$, $1\times10^{-6}$ Ωcm$^2$ is implemented. (3) In the related-art configuration, the contact is obtained by forming an interfacial reaction layer between the source electrode and the $n^+$ and $p^+$ regions at a high temperature. It is known that the mobility is significantly reduced since the dangling bonds are abundantly generated at the SiO$_2$/SiC substrate interface if the gate insulation film is formed, and a high-temperature process is performed. However, according to the present embodiment, only the low-temperature annealing is performed for a low-temperature additive pile up. As a result, it is recognized that the channel mobility increases at a single digit order (peak value of 200 cm$^2$/Vs after the process of the present embodiment) in comparison with the related art (peak value of 20 cm$^2$/Vs after the high-temperature heating process). Since this mobility improvement directly affects the on-resistance, device characteristics can be effectively improved. (4) When the electrode is exchanged with a TiN electrode, a polysilicon electrode, or a W electrode, a significant change does not appear. However, when the carbon ion implantation is not performed, dependence of the electrode significantly increases.

As described above, according to Example 1, the low-resistance contact between the p-type SiC region and metal and the low-resistance contact between the n-type SiC region and metal can be implemented at a low temperature. In addition, a single electrode can make contact with both the p-type SiC region and the n-type SiC region. That is, the source electrode may make ohmic contact with the p-type SiC region and the n-type SiC region neighboring each other. Meanwhile, the drain electrode may make ohmic contact with the rear surface n-type SiC region.

According to Example 1, since carbon ions are implanted, most of the carbon defects generated in the vicinity of the SiC/electrode interface are buried by carbon. As described above, if the processes are not applied, the amount of C defects becomes equal to or higher than $2.2 \times 10^{16}/cm^3$. However, if the processes are applied, the amount of C defects becomes $1.0 \times 10^{13}/cm^3$ or lower, which is reduced by three or more digit orders. As a result, an in-plane distribution of the contact resistance becomes negligible. In a device having such vertical type MOSFET units arranged in parallel, if there is a deviation of the resistance between units, the current flows in a part of the device and the device may be broken. According to the method, improvement is also made in such a problem.

Accurate measurement was made for the interfacial carbon and the interfacial nitrogen obtained by the present examples. As a result, approximately a monolayer-like distribution was observed. The surface densities of the interfacial carbon and the interfacial nitrogen were approximately $1.0 \times 10^{15}/cm^2$ and $0.8 \times 10^{15}/cm^2$, respectively.

EXAMPLE 2

In Example 1 described above, the n-type SiC region is formed between a plurality of p-type SiC regions by selectively implanting p-type dopants into the (n) SiC semiconductor layer 202. However, the embodiment is not limited thereto.

That is, in Example 2, the aforementioned embodiment is applied to the DiMOSFET/epi-channel, which will be described with reference to the drawings hereinafter.

Figure 11:
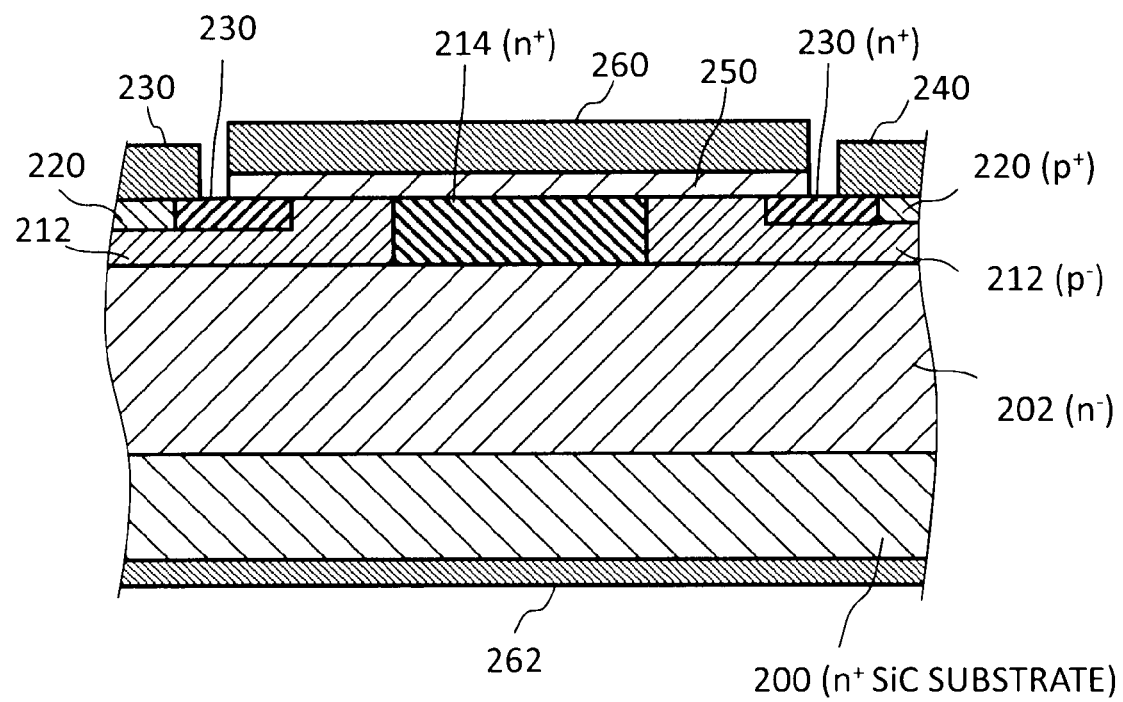
FIG. 11 is a cross-sectional view illustrating main parts of the semiconductor device according to Example 2.

FIG. 11 illustrates a configuration of the semiconductor device according to Example 2. Similar to FIG. 2, FIG. 11 illustrates a cross-sectional structure of the DiMOSFET. FIG. 11 is similar to FIG. 2 except that a plurality of low-concentration p-type ($p^-$) SiC semiconductor regions 212 having a predetermined film thickness are formed over the ($n^-$) SiC semiconductor layer 202 with an interval from each other, and the high-concentration n-type ($n^+$) SiC semiconductor region 214 is formed between the ($p^-$) SiC semiconductor regions 212. In addition, in the following description, the first embodiment will be similarly applied unless specified otherwise.

Figure 12:
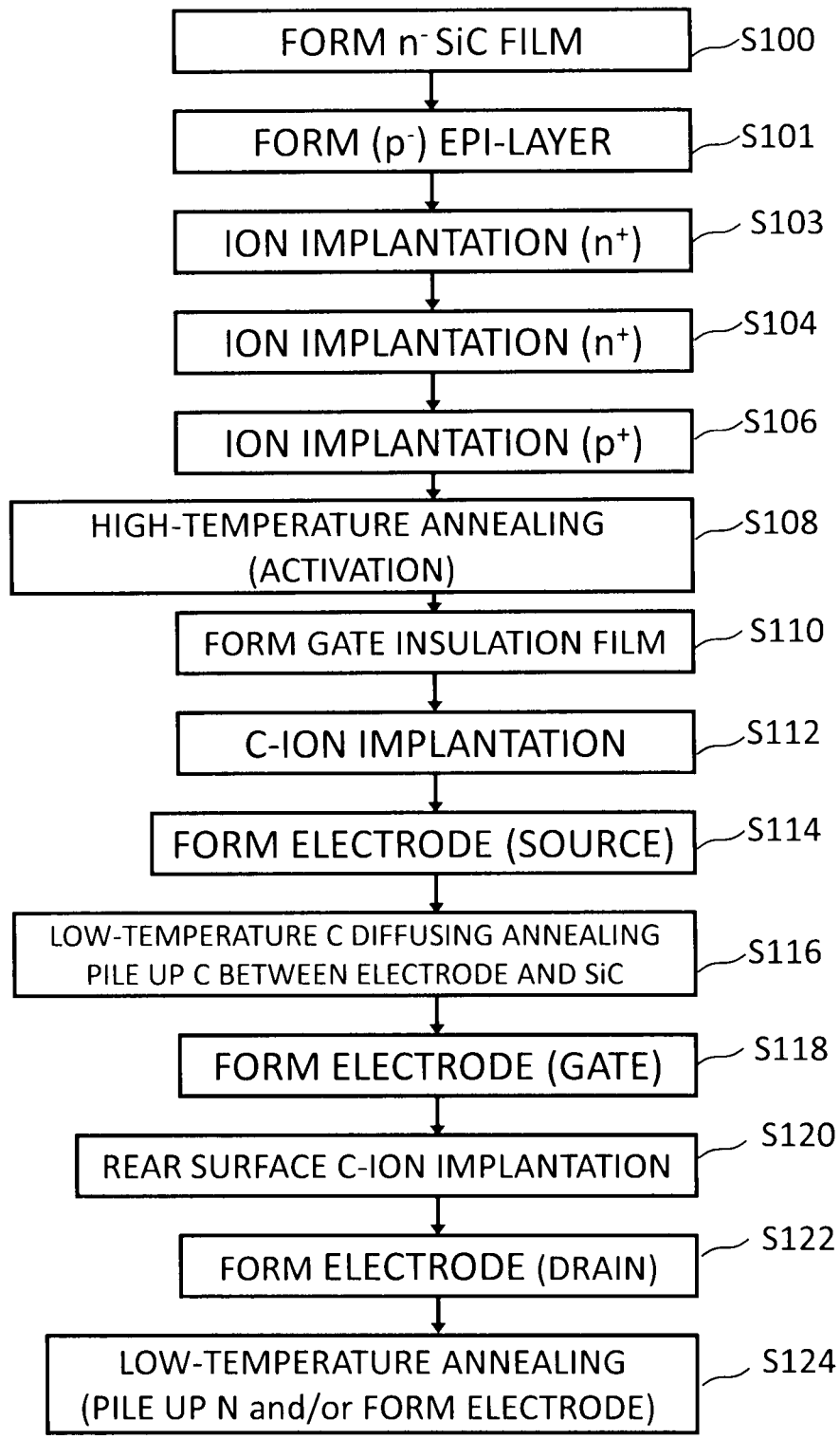
FIG. 12 is a flowchart illustrating a process of manufacturing the semiconductor device according to Example 2.

FIG. 12 is a flowchart illustrating main processes of a method of manufacturing the semiconductor device according to Example 2. FIG. 12 is similar to FIG. 3 except that a process S101 of forming the ($p^-$) SiC film 212 and the ($n^+$) ion implantation process S103 for forming the ($n^+$) SiC film 214 are added between the ($n^-$) SiC film forming process S100 and the ($n^+$) ion implantation process S104 instead of the ($p^-$) ion implantation process S102 of the first embodiment.

Figure 13A:
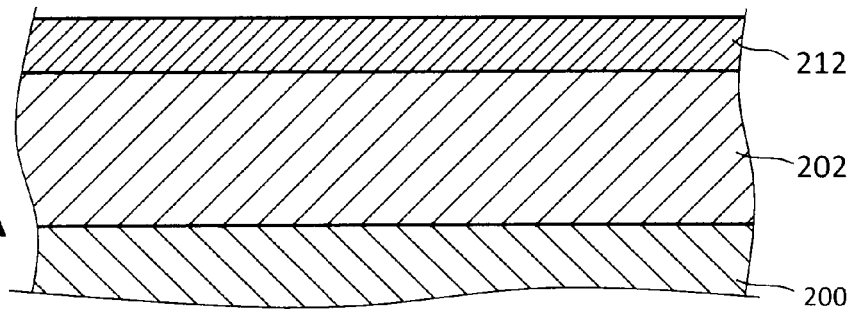
FIGS. 13A to 13C are cross-sectional views illustrating a process of manufacturing the semiconductor device according to Example 2.
Figure 13B:
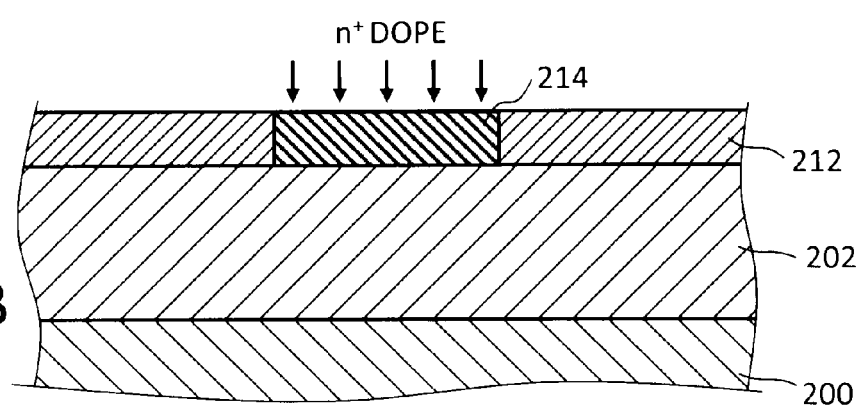
Figure 13C:
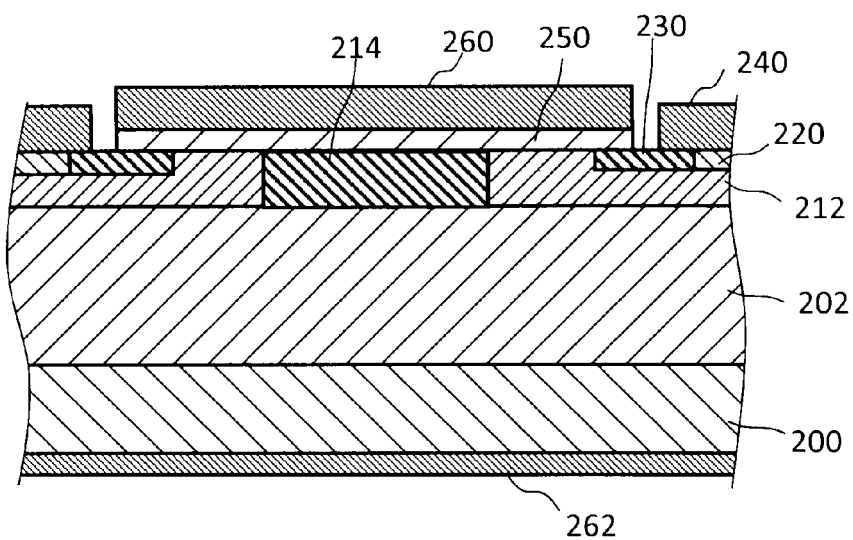

FIGS. 13A to 13C illustrate a process performed according to the flowchart of a method of manufacturing the semiconductor device according to Example 2. FIGS. 13A to 13C illustrate processes from the ($p^-$) SiC film forming process S101 to the final low-temperature annealing process S124.

Referring to FIG. 13A, in the ($p^-$) SiC film forming process S101, the ($p^-$) SiC semiconductor layer 212 is epitaxially grown on the ($n^-$) SiC semiconductor layer 202. For example, the film thickness is set to 0.6 μm. In this case, it is preferable that the impurity concentration in the ($n^+$) SiC semiconductor substrate 200 side of 0.4 μm be set to, for example, $4 \times 10^{17}/cm^3$, and the impurity concentration in the surface side of 0.2 μm be set to, for example, $1 \times 10^{16}/cm^3$. Aluminum (Al) is used as the p-type impurity.

Referring to FIG. 13B, in the ($n^+$) ion implantation process S103, nitrogen (N) ions are selectively implanted into the ($p^-$) SiC semiconductor layer 212 to form the ($n^+$) SiC semiconductor region 214. Specifically, first, an ion implantation mask is formed. For example, a polysilicon film is grown, a predetermined resist mask process is performed, and then, the polysilicon film is patterned. In this case, the etching condition of polysilicon is set to strong anisotropy, for example, reactive ion etching. Since the etching is anisotropic, the mask is patterned in a rectangular shape. Nitrogen ions are implanted using the ion implantation mask, and the $p^+$ epi-layer is modified to the n-type and is connected to the underlying (ni SiC semiconductor layer 202. As a result, the remaining part of the ($p^-$) SiC semiconductor layer 212 that has not been modified to the ($n^+$) SiC semiconductor region 214 is modified to the ($p^-$) SiC semiconductor region 210 in FIG. 2.

The subsequent processes are similar to those of Example 1. As a result, as illustrated in FIG. 13C, it is possible to form the semiconductor device similar to that of Example 1. In Example 2, the ion implantation for the MOS channel region is not necessary. Therefore, it is possible to prevent a MOS interface deterioration caused by the ion implantation.

EXAMPLE 3

In each example described above, description will be made for DiMOSFET. However, the applicable semiconductor device is not limited thereto. In Example 3, description will be made for a case where the embodiment is applied to the insulated gate bipolar transistor (IGBT).

Figure 14:
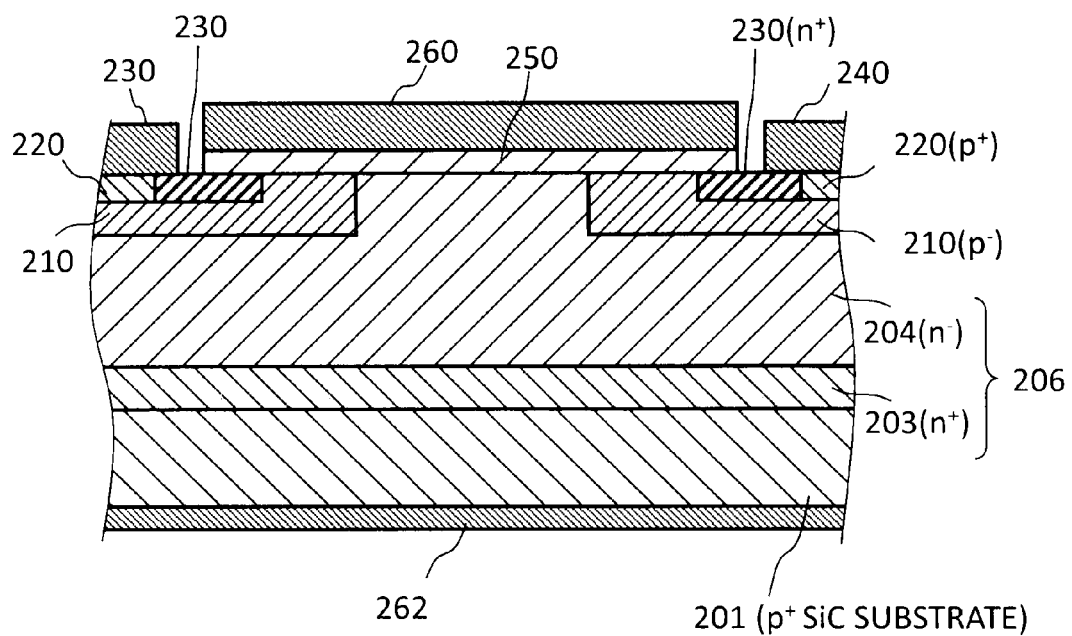
FIG. 14 is a cross-sectional view illustrating main parts of the semiconductor device according to Example 3.

FIG. 14 illustrates a configuration of the semiconductor device according to Example 3. FIG. 14 illustrates a cross-sectional structure of the IGBT as an example. FIG. 14 is similar to FIG. 2 except that the p-type (p+) SiC semiconductor substrate 201 is used instead of the n-type ($n^+$) SiC semiconductor substrate 200, and the ($n^+$) SiC semiconductor layer 203 and the ($n^-$) SiC semiconductor layer 204 have a stack structure as the n-type semiconductor layer 206 instead of the ($n^-$) SiC semiconductor layer 202. In other words, the high-concentration n-type ($n^+$) SiC semiconductor layer 203 is formed and arranged on the surface of the high-concentration p-type ($p^+$) SiC semiconductor substrate 201. In addition, the low-concentration n-type ($n^-$) SiC semiconductor layer 204 is formed and arranged on the n-type ($n^+$) SiC semiconductor layer 203. The n-type semiconductor layer 206 serves as a withstanding voltage maintaining layer. The ($p^+$) SiC semiconductor substrate 201 is an example of the first p-type SiC semiconductor section.

In addition, the electrode 262 made of a conductive material is connected and arranged on the rear surface of the ($p^+$) SiC semiconductor substrate 201. The electrode 262 serves as the collector electrode. The electrode 262 is an example of the third electrode. In this case, the ($p^+$) SiC semiconductor substrate 201 contains carbon such that a surface density distribution has a peak at the interface with the electrode 262. The electrode 262 makes ohmic contact with the rear surface of the ($p^+$) SiC semiconductor substrate 201. In addition, the electrode 240 serves as the emitter electrode according to the third embodiment. As described above, the electrode 240 makes ohmic contact with the n-type ($n^+$) SiC semiconductor region 230 and the p-type ($p^+$) SiC semiconductor region 220.

As described above, since a pinning material for each of the n-type SiC and the p-type SiC is contained such that the surface density distribution has a peak at the interface with the electrode, it is possible to lower the resistance in both the n-type and the p-type. In addition, it is possible to form the electrode using a single kind of metal on both the n-type ($n^+$) SiC semiconductor region 230 and the p-type ($p^+$) SiC semiconductor region 220. In Example 3, it is possible to lower all of a resistance of the junction between the n-type ($n^+$) SiC semiconductor region 230 and the electrode 240 serving as the emitter electrode, a resistance of the junction between the p-type (p$^+$) SiC semiconductor region 220 and the electrode 240 serving as the emitter electrode, and a resistance of the junction between the rear surface of the (p$^+$) SiC semiconductor substrate 201 and the electrode 262 serving as the collector electrode. However, the embodiment is not limited thereto, but may be embodied so as to lower only one or two of a resistance of the junction between the n-type (n$^+$) SiC semiconductor region 230 and the electrode 240 serving as the emitter electrode, a resistance of the junction between the p-type (p$^+$) SiC semiconductor region 220 and the electrode 240 serving as the emitter electrode, and a resistance of the junction between the rear surface of the (p$^+$) SiC semiconductor substrate 201 and the electrode 262 serving as the collector electrode.

Figure 15:
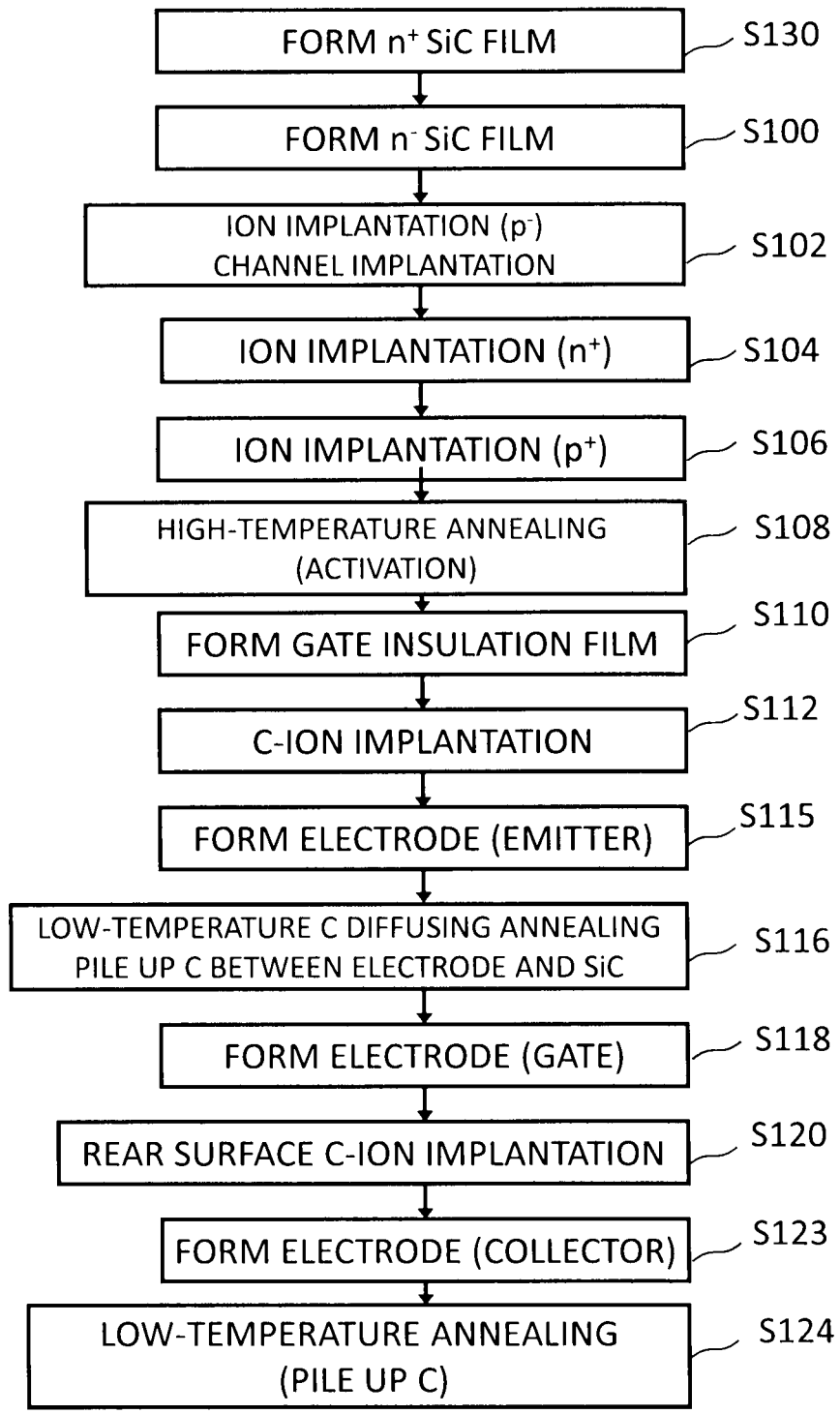
FIG. 15 is a flowchart illustrating a process of manufacturing the semiconductor device according to Example 3.

FIG. 15 illustrates main processes of a method of manufacturing the semiconductor device according to Example 3. FIG. 15 is similar to FIG. 3 except that a (n$^+$) SiC film forming process S130 is added before the (n$^-$) SiC film forming process S100, an electrode (emitter electrode) forming process S115 is added instead of the electrode (source electrode) forming process S114, and an electrode (collector electrode) forming process S123 is added instead of the electrode (drain electrode) forming process S122.

In the (n$^+$) SiC film forming process (S130), the (n$^+$) SiC semiconductor layer 203 is formed on the surface of the (p$^+$) SiC semiconductor substrate 201. The (n$^+$) SiC semiconductor layer 203 serves as the collector layer. The (n$^+$) SiC semiconductor layer 203 is formed through epitaxial growth. Nitrogen (N) is used as the impurity (dopant).

In addition, in the (n$^-$) SiC film forming process S100, the (n$^-$) SiC semiconductor layer 205 is formed on the (n$^+$) SiC semiconductor layer 203. Similar to the (n) SiC semiconductor layer 202, the (n$^-$) SiC semiconductor layer 205 is formed through epitaxial growth. It is preferable that the (n$^-$) SiC semiconductor layer 202 have a film thickness, for example, equal to or larger than 0.5 µm and equal to or smaller than 20 µm. Here, for example, the (n$^-$) SiC semiconductor layer 202 has a film thickness of 10 µm.

Then, processes similar to those of the first embodiment are performed until the insulation film forming process S110. The following electrode (emitter electrode) forming process S115 is similar to the electrode (source electrode) forming process S114 except that the source electrode is exchanged with the emitter electrode. Then, processes similar to those of the first embodiment are performed until the electrode (gate electrode) forming process S118.

In the electrode (collector electrode) forming process S123, the electrode 262 serving as the collector electrode is formed on the rear surface of the (p$^+$) SiC semiconductor substrate 201. Here, similar to the first embodiment, the rear surface carbon ion implantation, the electrode formation, and the annealing are performed. However, carbon piles up at the interface. That is, the final structure is different from that of the MOSFET using the n-type substrate, in which nitrogen piles up.

In the low-temperature annealing process S124, a heat treatment is performed at 400° C. For example, the heat treatment is performed under an argon (Ar) gas atmosphere for a heating time of 5 minutes. Through such a heat treatment, carbon can be gathered (pile up) at the interface between the electrode 262 and the (p$^+$) SiC semiconductor substrate 201. In this case, although a thin film of NiSi is formed in the vicinity of the interface, carbon piles up at the interface with SiC so as to make ohmic contact.

As described above, in Example 3, it is possible to obtain high-performance IGBT. Due to the bipolar operation, conductivity is changed, and the on-resistance is lowered. As a result, it is possible to significantly increase the electric conductivity performance in comparison with the aforementioned DiMOSFET. In this case, the hole current flows in addition to the electron current, it is important to lower a contact resistance between the emitter electrode and the p+ region. According to the third embodiment, a sufficiently low contact resistance can be obtained. Therefore, the technology of the third embodiment is significantly effective in the IGBT device manufacturing with micromachining in the future.

EXAMPLE 4

Although the p-type dopants are selectively implanted into the (n$^-$) SiC semiconductor layer 203 to form the n-type SiC region between a plurality of p-type SiC regions in Example 3, the embodiment is not limited thereto. In Example 4, the configuration of Example 2 is applied to the IGBT.

Figure 16:
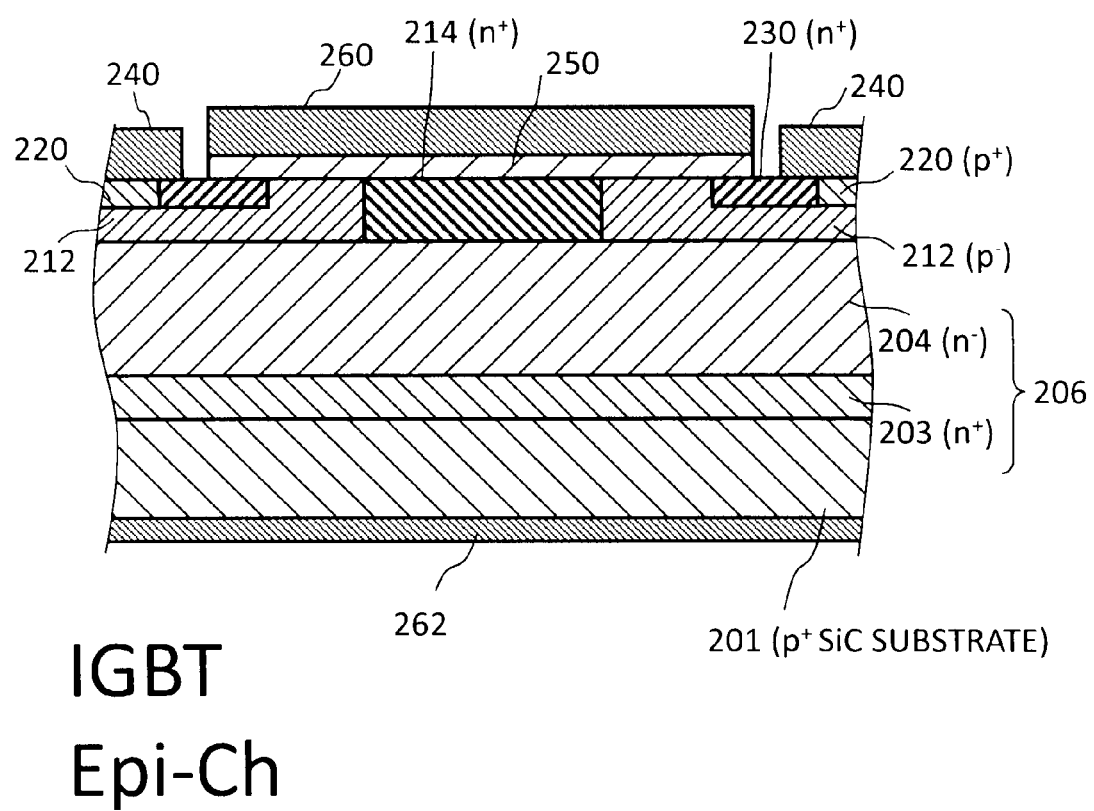
FIG. 16 is a cross-sectional view illustrating main parts of the semiconductor device according to Example 4.

FIG. 16 illustrates a configuration of the semiconductor device according to Example 4. Similar to FIG. 14, FIG. 16 illustrates a cross-sectional structure of the IGBT. FIG. 16 is similar to FIG. 14 except that a plurality of low-concentration p-type (p$^-$) SiC semiconductor regions 212 having a predetermined film thickness are formed on the (n$^-$) SiC semiconductor layer 203 with an interval from each other, and the high-concentration n-type (n$^+$) SiC semiconductor region 214 is formed between the (p$^-$) SiC semiconductor regions 212. In addition, the third embodiment is similarly applied unless specified otherwise.

Figure 17:
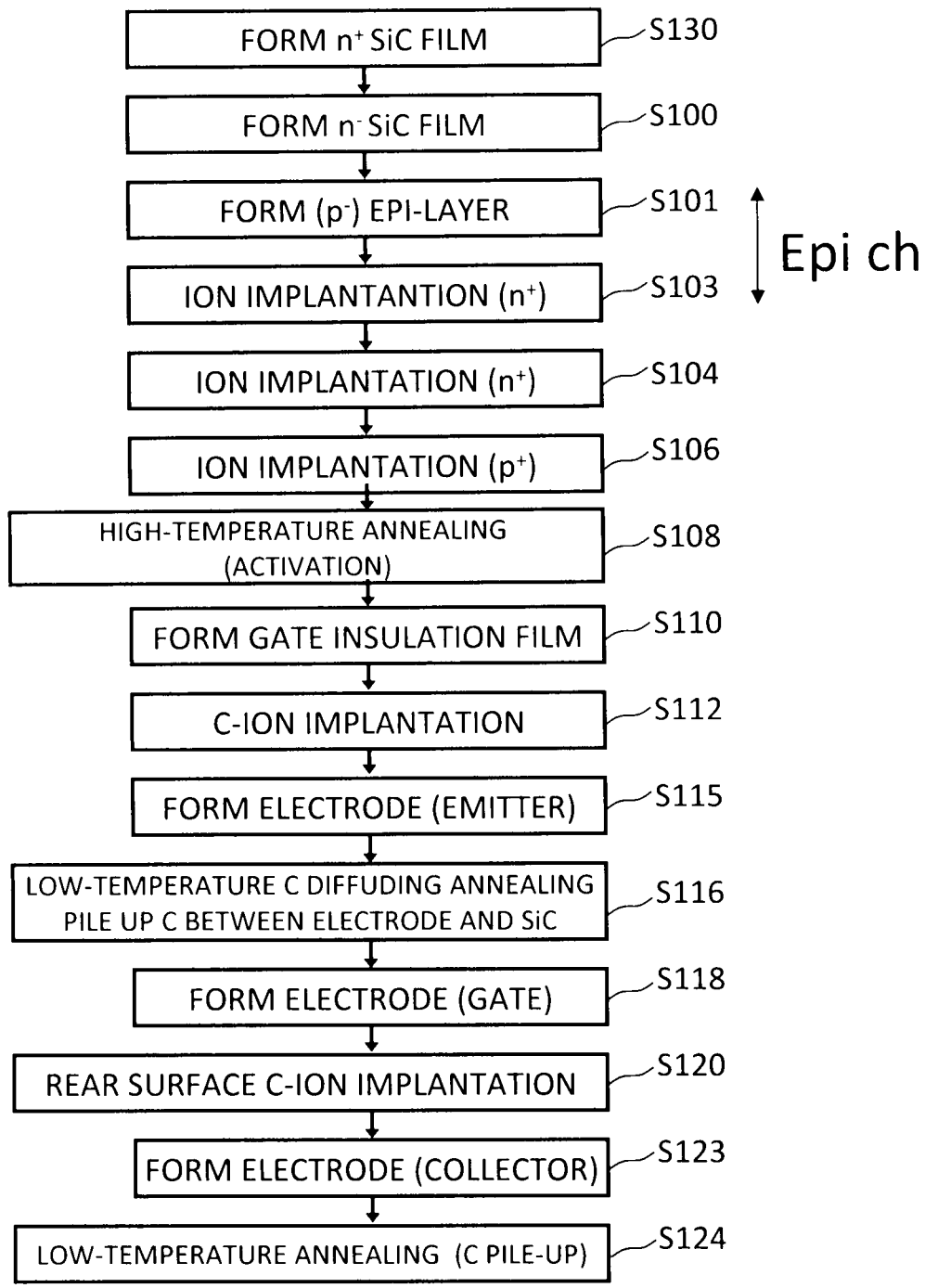
FIG. 17 is a flowchart illustrating a process of manufacturing the semiconductor device according to Example 4.

FIG. 17 is a flowchart illustrating main processes of a method of manufacturing the semiconductor device according to Example 4. FIG. 17 is similar to FIG. 15 except that the a process S101 for forming the (p$^-$) SiC film 212 and the (n$^+$) ion implantation process S103 for forming the (n$^+$) SiC film 214 are added between the (n$^-$) SiC film forming process S100 and the (n$^{30}$) ion implantation process S104 instead of the (p$^-$) ion implantation process S102 of Example 1.

Subsequent processes are similar to those of Example 3. As a result, as illustrated in FIG. 16, it is possible to form the semiconductor device similar to Example 3. In Example 4, since it is not necessary to perform the ion implantation for the MOS channel region, it is possible to prevent the MOS interface deterioration caused by the ion implantation.

Although some embodiments and examples have been described hereinbefore, those embodiments are just exemplary and are not intended to limit the scope of the invention. Such embodiments may be embodied in various other forms, and various omissions, substitutions, or changes may be possible without departing from the spirit and scope of the invention. Such embodiments and modifications are construed to be included in the invention described in the claims and equivalents thereof as they are included in the scope or subject matter of the invention.

What is claimed is:

1. A semiconductor device comprising:
   a first electrode formed of a conductive material;
   a p-type first silicon carbide (SiC) semiconductor section, connected to the first electrode, containing carbon (C) such that a surface density distribution has a peak less than 1 nm from a first interface with the first electrode; and
   an n-type second SiC semiconductor section connected to the first electrode,
   wherein carbon at the first interface is equal to or smaller than a single monolayer.

2. The semiconductor device according to claim 1,
wherein the n-type second SiC semiconductor section contains at least one element selected from a group including nitrogen (N), phosphorous (P), and arsenic (As) such that a surface density distribution has a peak at a second interface with the first electrode.

3. The semiconductor device according to claim 2,
wherein at least one element selected from a group including nitrogen, phosphorous, and arsenic of the second interface is equal to or smaller than a single monolayer.

4. The semiconductor device according to claim 2,
wherein a concentration of at least one element selected from a group including nitrogen, phosphorous, and arsenic at the second interface is equal to or higher than $1.2 \times 10^{14}/cm^2$ and equal to or lower than $1.8 \times 10^{15}/cm^2$.

5. The semiconductor device according to claim 2,
wherein the second interface is an interface between an upper surface of the n-type second SiC semiconductor section and a bottom surface of the first electrode.

6. The semiconductor device according to claim 2,
wherein the surface density distribution peak exists within less than 1 nm from the second interface.

7. The semiconductor device according to claim 1,
wherein a concentration of carbon at the first interface is equal to or higher than $1.2 \times 10^{14}/cm^2$ and equal to or lower than $1.8 \times 10^{15}/cm^2$.

8. The semiconductor device according to claim 1,
wherein the first interface comprises an interface between an upper surface of the first silicon carbide semiconductor section and a bottom surface of the first electrode.

9. A semiconductor device comprising:
a first electrode formed of a conductive material;
a p-type first silicon carbide (SiC) semiconductor section, connected to the first electrode, containing carbon (C) such that a surface density distribution has a peak less than 1 nm from a first interface with the first electrode; and
an n-type second SiC semiconductor section connected to the first electrode,
wherein the n-type second SiC semiconductor section contains at least one element selected from a group including nitrogen (N), phosphorous (P), and arsenic (As) such that a surface density distribution has a peak at a second interface with the first electrode, and
carbon at the first interface is equal to or smaller than a single monolayer, and at least one element selected from a group including nitrogen, phosphorous, and arsenic of the second interface is equal to or smaller than a single monolayer.

10. The semiconductor device according to claim 9,
wherein a concentration of carbon at the first interface is equal to or higher than $1.2 \times 10^{14}/cm^2$ and equal to or lower than $1.8 \times 10^{15}/cm^2$.

11. The semiconductor device according to claim 9,
wherein a concentration of at least one element selected from a group including nitrogen, phosphorous, and arsenic at the second interface is equal to or higher than $1.2 \times 10^{14}/cm^2$ and equal to or lower than $1.8 \times 10^{15}/cm^2$.

12. The semiconductor device according to claim 9,
wherein the first interface comprises an interface between an upper surface of the first silicon carbide semiconductor section and a bottom surface of the first electrode.

13. The semiconductor device according to claim 9,
wherein the second interface is an interface between an upper surface of the n-type second SiC semiconductor section and a bottom surface of the first electrode.

14. The semiconductor device according to claim 9,
wherein the surface density distribution peak exists within less than 1 nm from the second interface.

* * * * *